United States Patent
Chang et al.

(10) Patent No.: US 12,543,412 B2
(45) Date of Patent: Feb. 3, 2026

(54) SEMICONDUCTOR LIGHT EMITTING DEVICE FOR DISPLAY PIXEL AND DISPLAY DEVICE INCLUDING THE SAME

(71) Applicant: LG ELECTRONICS INC., Seoul (KR)

(72) Inventors: Wonjae Chang, Seoul (KR); Sunghyun Hwang, Seoul (KR); Chunghyun Lim, Seoul (KR); Minwoo Lee, Seoul (KR); Myoungsoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 332 days.

(21) Appl. No.: 18/224,319

(22) Filed: Jul. 20, 2023

(65) Prior Publication Data

US 2024/0030182 A1  Jan. 25, 2024

(30) Foreign Application Priority Data

Jul. 21, 2022 (KR) .................. 10-2022-0090286
Jan. 19, 2023 (KR) .................. 10-2023-0008185

(51) Int. Cl.
*H10H 20/831* (2025.01)
*H10H 20/84* (2025.01)
(Continued)

(52) U.S. Cl.
CPC .......... *H10H 20/831* (2025.01); *H10H 20/84* (2025.01); *H01L 2224/95144* (2013.01); *H10H 29/012* (2025.01); *H10H 29/03* (2025.01)

(58) Field of Classification Search
CPC .......... H10K 29/10–142; H10K 29/20; H10K 29/80–842; H10K 20/831–835; H10K 20/84
See application file for complete search history.

(56) References Cited

U.S. PATENT DOCUMENTS 6,687,987 B2   2/2004  Mayer et al.
10,236,324 B1  3/2019  Do et al.
(Continued)

FOREIGN PATENT DOCUMENTS

CN  109216400 A  *  1/2019  .......... H10H 20/832
EP  3 993 049 A1    5/2022
(Continued)

OTHER PUBLICATIONS

Adams et al., "Separation of Neural Stem Cells by Whole Cell Membrane Capacitane using Dielectrophoresis," Methods, vol. 133, Jan. 15, 2018, pp. 91-103.

(Continued)

*Primary Examiner* — Mariceli Santiago
(74) *Attorney, Agent, or Firm* — Birch, Stewart, Kolasch & Birch, LLP

(57) ABSTRACT

Embodiment relates to a semiconductor light emitting device for a display pixel and a display device including the same. A semiconductor light emitting device for a display pixel according to an embodiment includes a light emitting structure including a first conductivity type semiconductor layer, an active layer, and a second conductivity type semiconductor layer, the first conductivity type semiconductor layer in the semiconductor light emitting device for a display pixel, a first contact electrode electrically connected to, a metal layer disposed under the first conductivity-type semiconductor layer, a second contact electrode disposed on the second conductivity-type semiconductor layer, and a passivation disposed on the light emitting structure may contain layers. The metal layer may include a magnetic material, and a weight ratio of the magnetic material to the weight of the semiconductor light emitting device may be 0.25% to 36.75%.

13 Claims, 15 Drawing Sheets

(a)

(b)

(51) Int. Cl.
H10H 29/01 (2025.01)
H10H 29/03 (2025.01)

(56) References Cited

U.S. PATENT DOCUMENTS

| | | |
|---|---|---|
| 10,418,527 B2 | 9/2019 | Sasaki et al. |
| 2020/0251608 A1 | 8/2020 | Cho et al. |
| 2022/0149236 A1 | 5/2022 | Lee et al. |
| 2022/0302351 A1 | 9/2022 | Cho et al. |
| 2022/0351993 A1 | 11/2022 | Jeong et al. |
| 2022/0393074 A1 | 12/2022 | Heo et al. |
| 2022/0415859 A1 | 12/2022 | Choi et al. |
| 2023/0047241 A1 | 2/2023 | Hwang et al. |
| 2023/0059135 A1 | 2/2023 | Chang et al. |
| 2023/0107331 A1 | 4/2023 | Heo et al. |
| 2023/0317669 A1 | 10/2023 | Lee et al. |
| 2023/0327062 A1 | 10/2023 | Kim et al. |
| 2023/0335674 A1* | 10/2023 | Park ............... H10H 20/819 |
| 2023/0395762 A1 | 12/2023 | Hwang et al. |
| 2023/0402489 A1 | 12/2023 | Hwang et al. |

FOREIGN PATENT DOCUMENTS

| | | | |
|---|---|---|---|
| EP | 3 996 139 A1 | 5/2022 | |
| EP | 3 996 155 A1 | 5/2022 | |
| KR | 10-2006-0129801 A | 12/2006 | |
| KR | 10-1730927 B1 | 4/2017 | |
| KR | 10-2019-0063201 A | 6/2019 | |
| KR | 10-2019-0143840 A | 12/2019 | |
| KR | 10-2020-0023319 A | 3/2020 | |
| KR | 10-2020-0023328 A | 3/2020 | |
| KR | 10-2020-0026681 A | 3/2020 | |
| KR | 10-2020-0026760 A | 3/2020 | |
| KR | 10-2020-0026766 A | 3/2020 | |
| KR | 10-2020-0095210 A | 8/2020 | |
| WO | WO-2019203405 A1 * | 10/2019 | ........... H10H 20/857 |
| WO | WO 2020/159046 A1 | 8/2020 | |
| WO | WO 2022/019346 A1 | 1/2022 | |
| WO | WO 2022/034937 A1 | 2/2022 | |
| WO | WO 2022/097785 A1 | 5/2022 | |
| WO | WO 2022/114255 A1 | 6/2022 | |

OTHER PUBLICATIONS

Anwar et al., "Recent Progress in Micro-LED-Based Display Technologies," Laser & Photonics Reviews, vol. 16, 2100427, 2022, pp. 1-20.
Berthier et al., "Self-alignment of silicon chips on wafers: A capillary approach," J. Appl. Phys., vol. 108, 2010, pp. 054905-1 to 054905-10.
Cetin et al., "Dielectrophoresis in microfluidics technology," Electrophoresis, vol. 32, 2011, pp. 2410-2427.
Chen et al., "Fabrication and Characterization of Active-Matrix 960 x 540 Blue GaN-Based Micro-LED Display," IEEE Journal of Quantum Electronics, vol. 55, No. 2, Apr. 2019, 6 pages total.
Cho et al., "Fluidic Self-Assembly Transfer Technology for Micro-LED Display", Int. Solid State Sens. Actuators Microsyst. Conf., 2019, pp. 402-404.
Fang et al., "Parallel micro component-to-substrate assembly with controlled poses and high surface coverage", J. Micromech. and Microeng., vol. 16, Mar. 6, 2006, pp. 721-730.
Freer et al., "High-yield self-limiting single-nanowire assembly with dielectrophoresis," Nature Nanotechnology, vol. 5, Jul. 2010, pp. 525-530 (8 pages total).
Gangwal et al., "Dielectrophoretic Assembly of Metallodielectric Janus Particles in AC Electric Fields," vol. 24, No. 23, 2008 (Published online Oct. 31, 2008), pp. 13312-13320.
Ginoudi et al., "Donor related deep traps in mombe Ga0.51In0.49/GaAs heterostructures: influence on the low temperature performance of HEMTs," Proc. 4th Int. Conf. Inp. and Rel. Mater., 1992, pp. 389-392.
Gong, "Layer-Scale and Chip-Scale Transfer Techniques for Functional Devices and Systems: A Review," Nanomaterials, vol. 11, No. 842, Mar. 25, 2021, pp. 1-41.
Honegger et al., "4-D dielectrophoretic handling of Janus particles in a microfluidic chip," Microelectronic Engineering, vol. 87, 2010 (Available online Nov. 29, 2009), pp. 756-759.
Hoo et al., "Template-based self-assembly for silicon chips and 01005 surface-mount components", J. Micromech. Microeng., 2014, vol. 24, 045018 (7 pages).
Huang et al., "Mini-LED, Micro-LED and OLED displays: present status and future perspectives," Light: Science & Applications, vol. 9, No. 105, 2020, pp. 1-16.
Jacobs et al., "Fabrication of a Cylindrical Display by Patterned Assembly", Science, vol. 296, Apr. 12, 2002, pp. 323-325.
Kim et al., "Control of adhesion force for micro LED transfer using a magnetorheological elastomer," Journal of Mechanical Science and Technology, vol. 33, No. 11, 2019, pp. 5321-5325.
Kim et al., "Stretchable, Transparent Graphene Interconnects for Arrays of Microscale Inorganic Light Emitting Diodes on Rubber Substrates," Nano Lett., vol. 11, 2011, pp. 3881-3886.
Knuesel et al., "Self-assembly of microscopic chiplets at a liquid-liquid-solid interface forming a flexible segmented monocrystalline solar cell," PNAS, Jan. 19, 2010, vol. 107, No. 3, pp. 993-998.
Li et al., "Study of Transfer-Printing Technologies for Micro-LED Displays," SID International Symposium Digest of Technical Papers, vol. 51, Issue S1, pp. 125-128.
Meitl et al., "Passive Matrix Displays with Transfer-Printed Microscale Inorganic LEDs," SID 2016 Digest, 2016, pp. 743-746.
Meitl et al., "Transfer printing by kinetic control of adhesion to an elastomeric stamp," Nature Materials, vol. 5, Jan. 2006, pp. 33-38.
Mertens et al., "eLux installs a new automated fluidic assembly R&D tool, unveils a new microLED display prototype," MicroledInfo, 2021, 3 pages total, retrieved from https://www.microled-info.com/elux-installs-new-automated-fluidic-assembly-rd-tool-unveils-new-microled.
Nakano et al., "Protein Dielectrophoresis: Advances, Challenges and Applications," Electrophoresis, vol. 34, No. 7, Apr. 2013, pp. 1-19.
Park et al., "A First Implementation of an Automated Reel-to-Reel Fluidic Self-Assembly Machine", Adv. Mater., 2014, vol. 26, pp. 5942-5949.
Park et al., "Approaching Roll-to-Roll Fluidic Self-Assembly: Relevant Parameters, Machine Design, and Applications," Journal of Microelectromechanical Systems, vol. 24, No. 6, Dec. 2015, pp. 1928-1937.
Park et al., "Horizontally assembled green InGaN nanorod LEDs: scalable polarized surface emitting LEDs using electric-field assisted assembly," Scientific Reports, vol. 6, No. 28312, Jun. 21, 2016, pp. 1-9.
Park et al., "Orientation-controlled parallel assembly at the air-water interface", J. Micromech., Microeng., 2012, vol. 22, 105028, pp. 1-11.
Park et al., "Parallel Heterogeneous Integration of Chip-Scale Parts by Self-Assembly," Journal of Microelectromechanical Systems, vol. 21, No. 6, Dec. 2012, pp. 1273-1275.
Pesch et al., "A review of dielectrophoretic separation and classification of non-biological particles," Electrophoresis, 2021, pp. 1-19.
Pohl, "The Motion and Precipitation of Suspensoids in Divergent Electric Fields," Journal of Applied Physics, vol. 22, No. 7, 1950, pp. 869-871.
Routa et al., "Surface Tension-Driven Self-Alignment of Microchips on Low-Precision Receptors", J. Microelectromech. Syst., Aug. 2014, vol. 23, No. 4, pp. 819-828.
Saito et al., Response of nonspherical biological particles to alternating electric fields, Biophys. J., vol. 6, 1966, pp. 313-327.
Shah et al., "Surface-Tension-Driven Self-Alignment of Microchips on Black-Silicon-Based Hybrid Template in Ambient Air", J. Microelectromech. Syst., Jun. 2013, vol. 22, No. 3, pp. 739-746.
Stauth et al., "Self-assembled single-crystal silicon circuits on plastic", Proc. Natl. Acad. Sci., Sep. 2006, vol. 103, No. 38, pp. 13922-13927.

(56) References Cited

OTHER PUBLICATIONS

Talghader et al., "Integration of Fluidically Self-Assembled Optoelectronic Devices Using a Silicon-Based Process," IEEE Photonics Technology Letters, vol. 7, No. 11, Nov. 1995, pp. 1321-1323.

Tsukahara et al., Dielectrophoretic Behavior of Single DNA Planar and Caplillary Quadrupole Microelectrodes, Chemistry Letters 2001, 2001, p. 250.

Virey et al., "Status and Prospects of microLED Displays," SID 2018 Digest, 2018, pp. 593-596.

Wang et al., "General expressional for dielectrophoretic force and electrorotational torque derived using the Maxwell stress tensor method," Journal of Electrostatics, vol. 39, 1997, pp. 277-295.

Xu et al., "Application of blue-green and ultraviolet micro-LEDs to biological imaging and detection," Journal of Physics D: Applied Physics, vol. 41, 094013, 2008, pp. 1-13.

Yeh et al., "Fluidic Self-Assembly for the Integration of GaAs Light-Emitting Diodes on Si Substrates," IEEE Photonics Technology Letters, vol. 6, No. 6, Jun. 1994, pp. 706-708.

\* cited by examiner

[FIG. 1A]
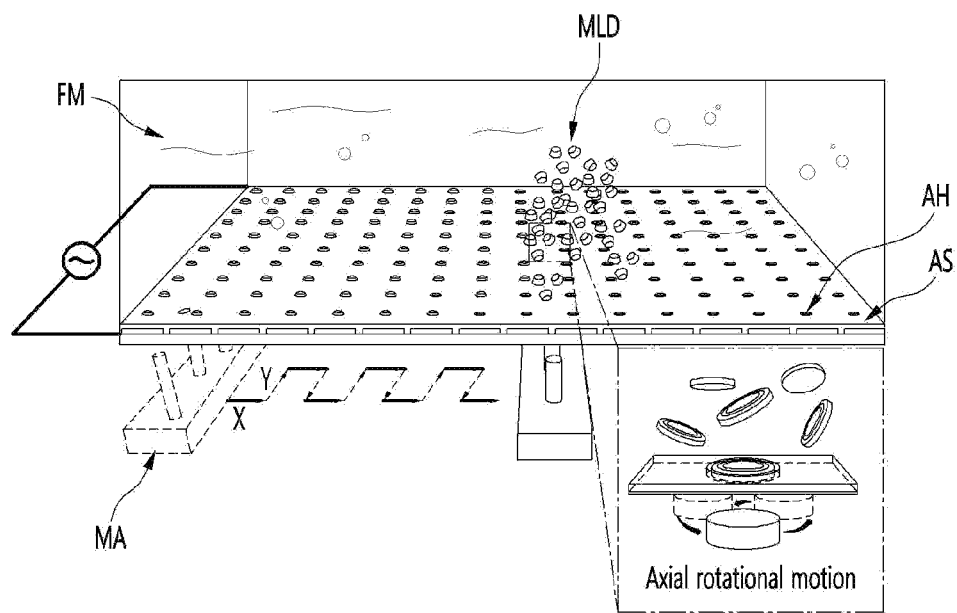
[FIG. 1B]
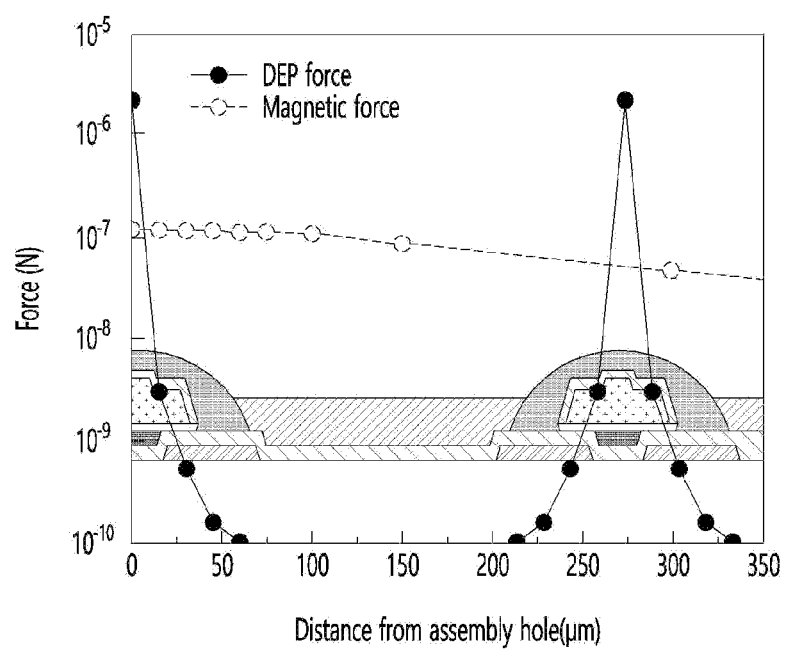

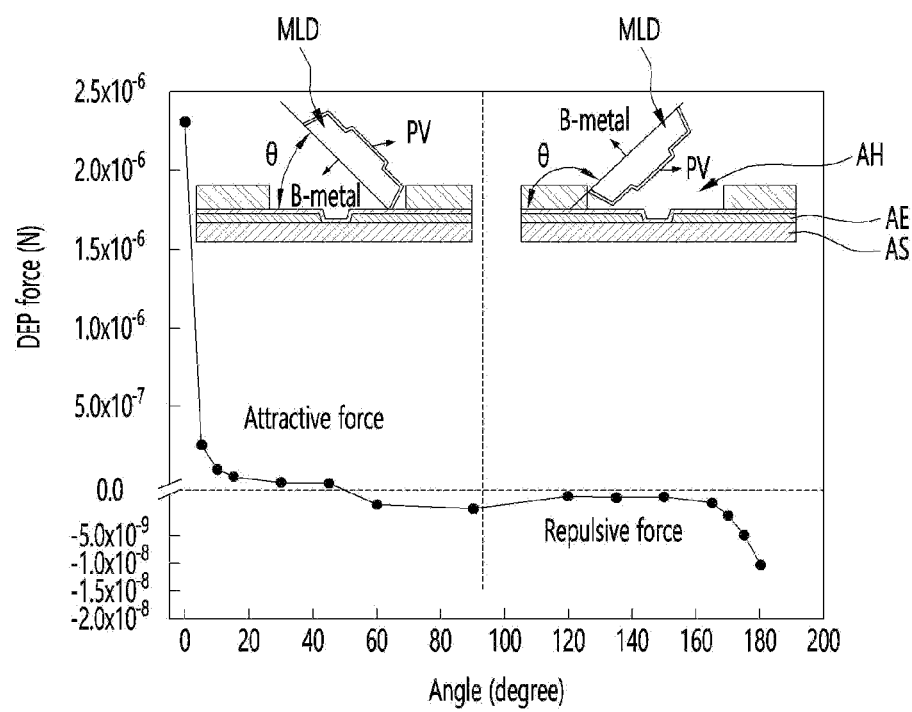
[FIG. 2]

[FIG. 3]
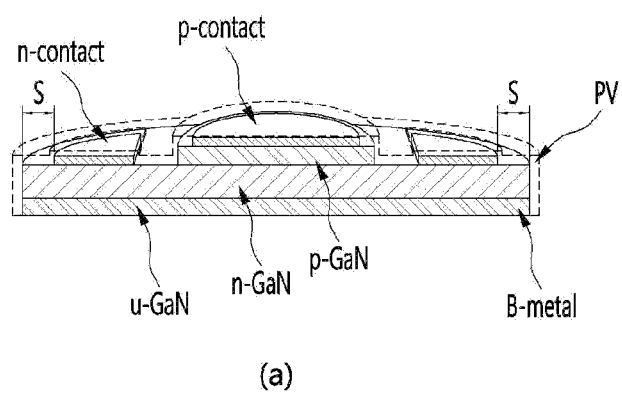
(a)
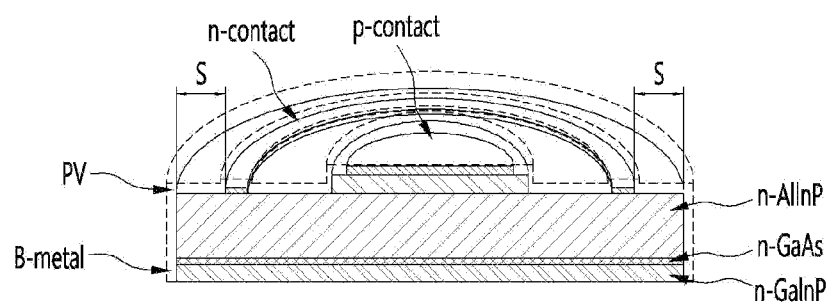
(b)

[FIG. 4]
| Angle | DEP force vector | Magnitude of DEP force vector [N] | X-axis component [N] | Y-axis component [N] | Z-axis component [N] |
|---|---|---|---|---|---|
| 0° |  | 2.3E-6 | 6.5E-10 | -4.7E-11 | 2.3E-6 |
| 5° |  | 2.6E-7 | -2.0E-10 | 2.0E-8 | 2.6E-7 |
| 10° |  | 1E-7 | -1.5E-10 | 1.5E-8 | 9.9E-8 |
| 15° |  | 5.2E-8 | 1.2E-10 | 1.1E-8 | 5.E-8 |
| 30° |  | 1.6E-8 | 1.1E-10 | 6.7E-9 | 1.4E-8 |
| 45° |  | 5.4E-9 | 3.9E-11 | 3.75E-9 | 3.9E-9 |
| 60° |  | 1.0E-9 | 5.8E-11 | -3.7E-10 | -9.8E-10 |
| 90° |  | 7.2E-9 | 1.1E-10 | -7E-9 | -1.7E-9 |
| 120° |  | 4.9E-9 | -7.5E-12 | -4.9E-9 | 3.7E-10 |
| 135° |  | 4E-9 | 1.1E-11 | -4.0E-9 | 1.3E-10 |
| 150° |  | 3E-9 | -7.4E-12 | -3.0E-9 | 2.9E-10 |
| 165° |  | 3E-9 | 1.4E-11 | -2.7E-9 | -8.9E-10 |
| 170° |  | 4E-9 | 8.9E-10 | -2.8E-9 | -2.8E-9 |
| 175° |  | 6.3E-9 | 2.6E-11 | -1.3E-9 | -6.1E-9 |
| 180° |  | 1.1E-8 | 2.7E-11 | -1.2E-9 | -1.1E-8 |

[FIG. 5]
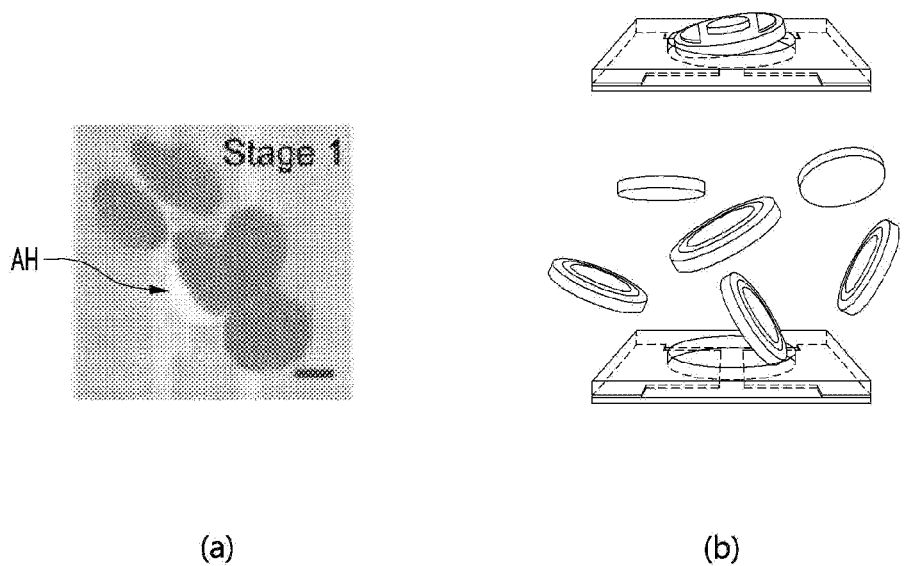
(a)          (b)
[FIG. 6]
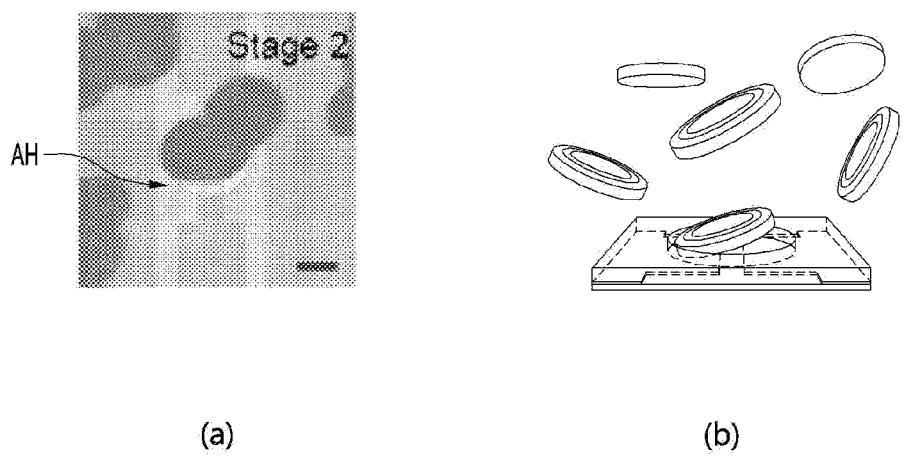
(a)          (b)

[FIG. 7]
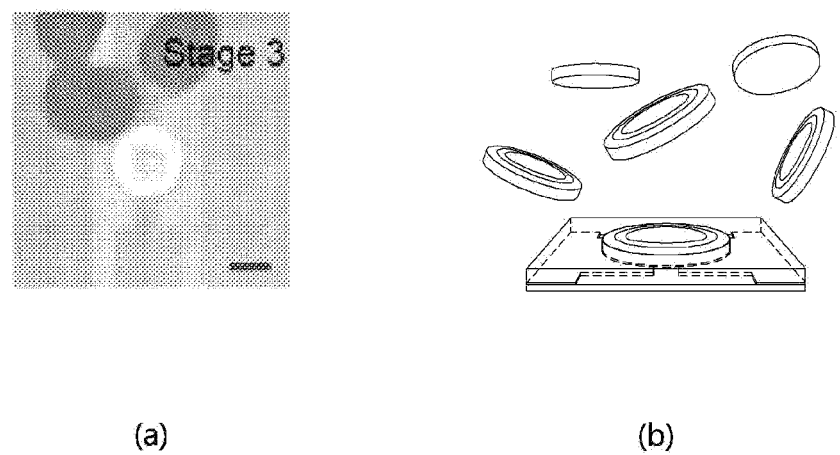
(a)　　　　　　　　　　　　　　(b)
[FIG. 8A]
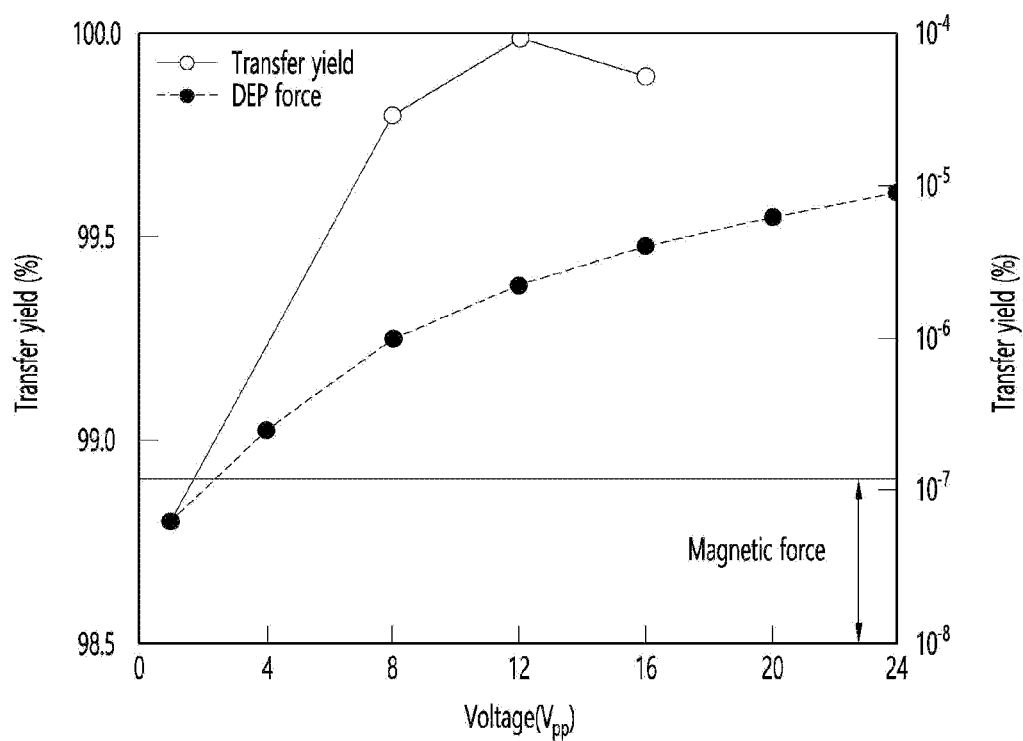

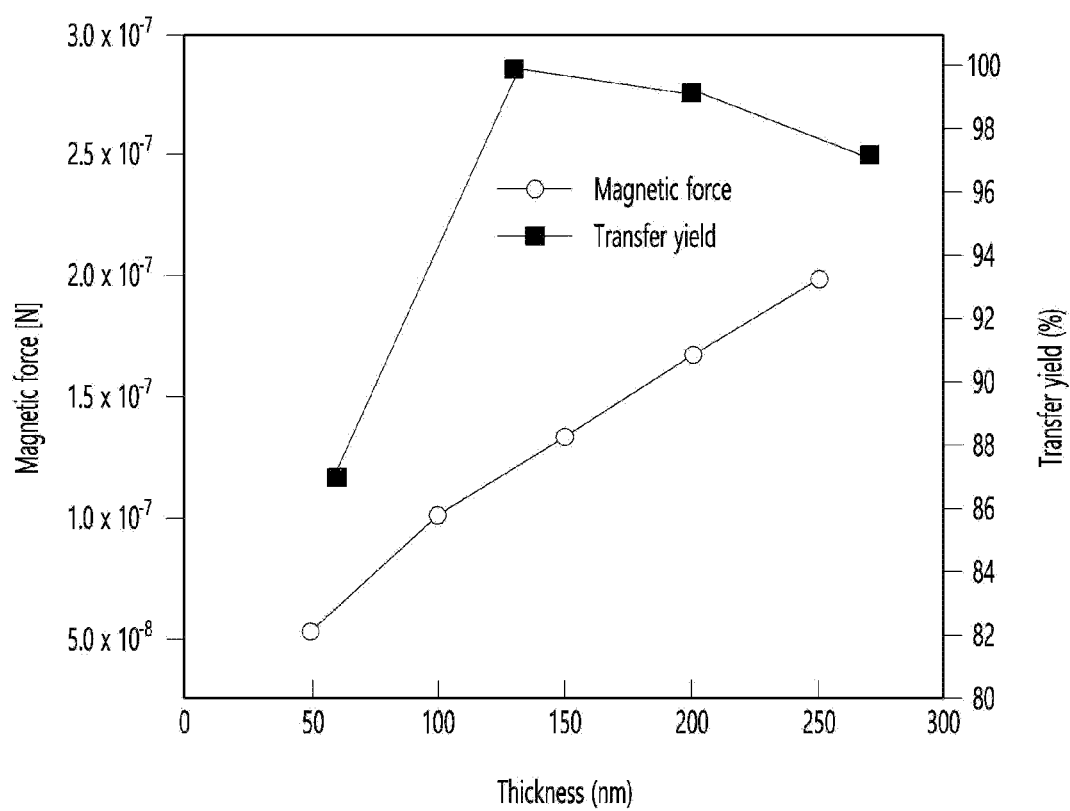
[FIG. 8B]

[FIG. 8C]
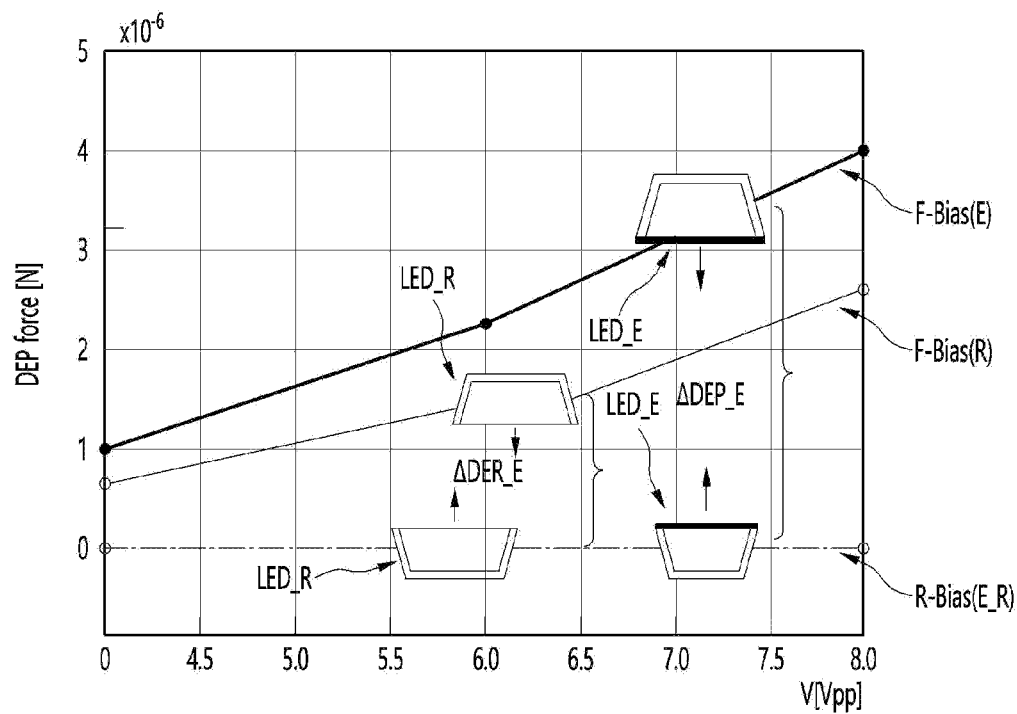
[FIG. 9]
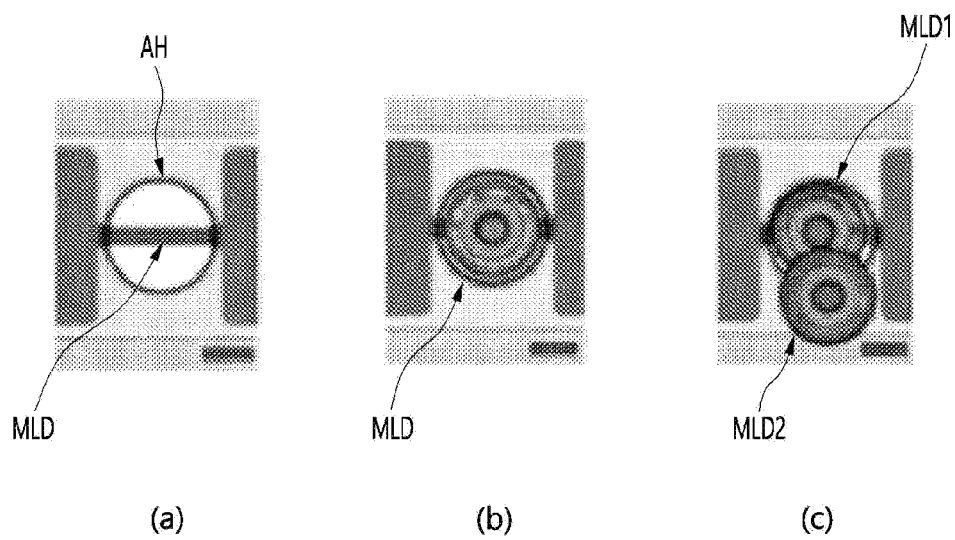
(a)　　　　　　　　(b)　　　　　　　　(c)

[FIG. 10]
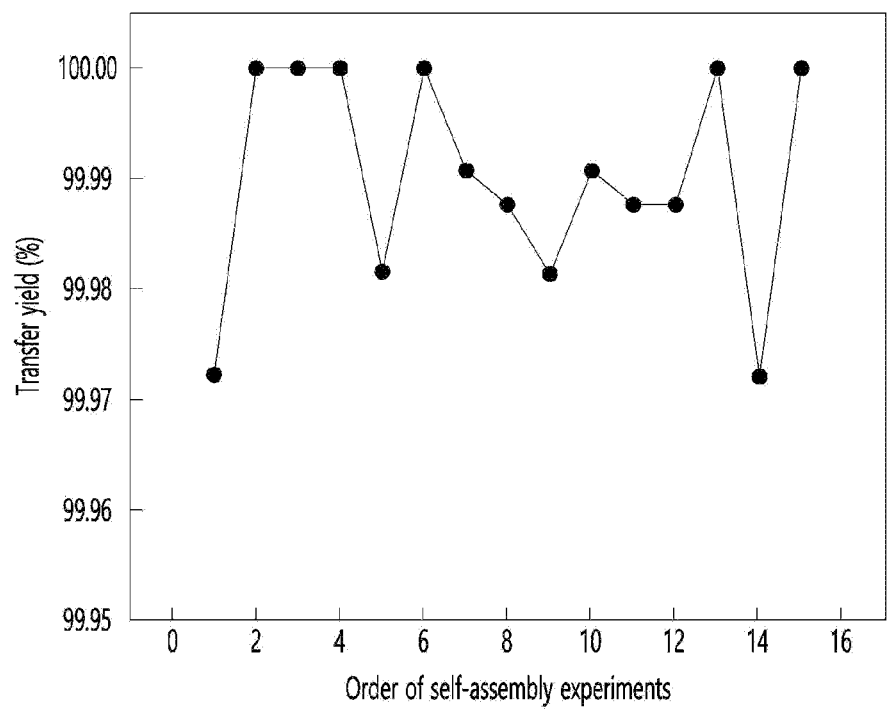
[FIG. 11]
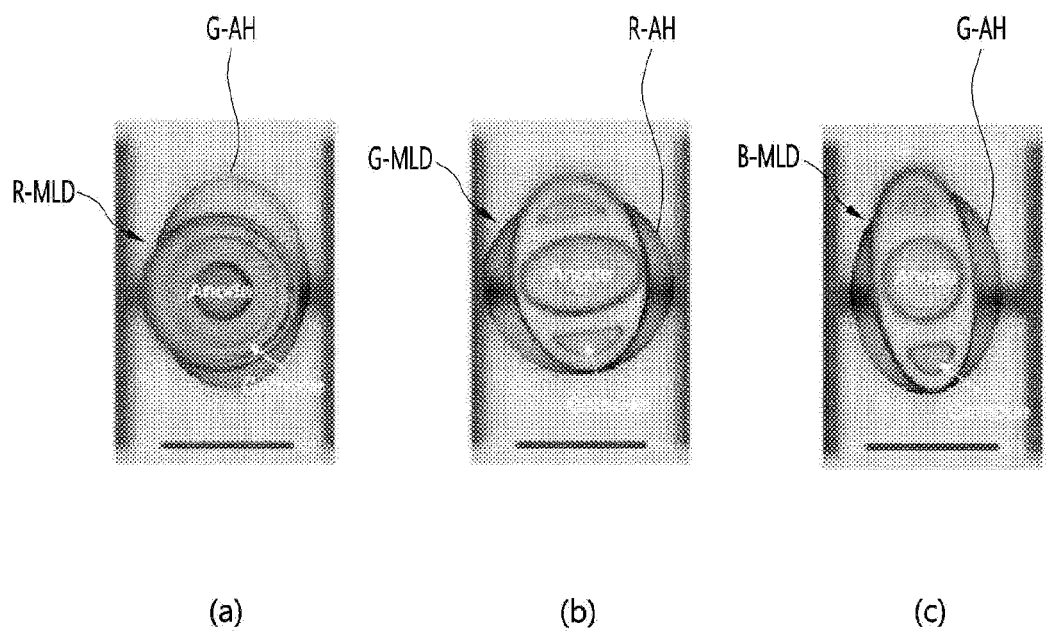
(a)          (b)          (c)

[FIG. 12]
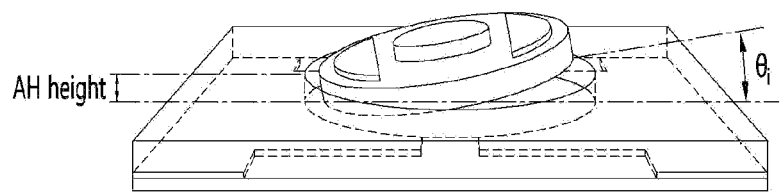
[FIG. 13]
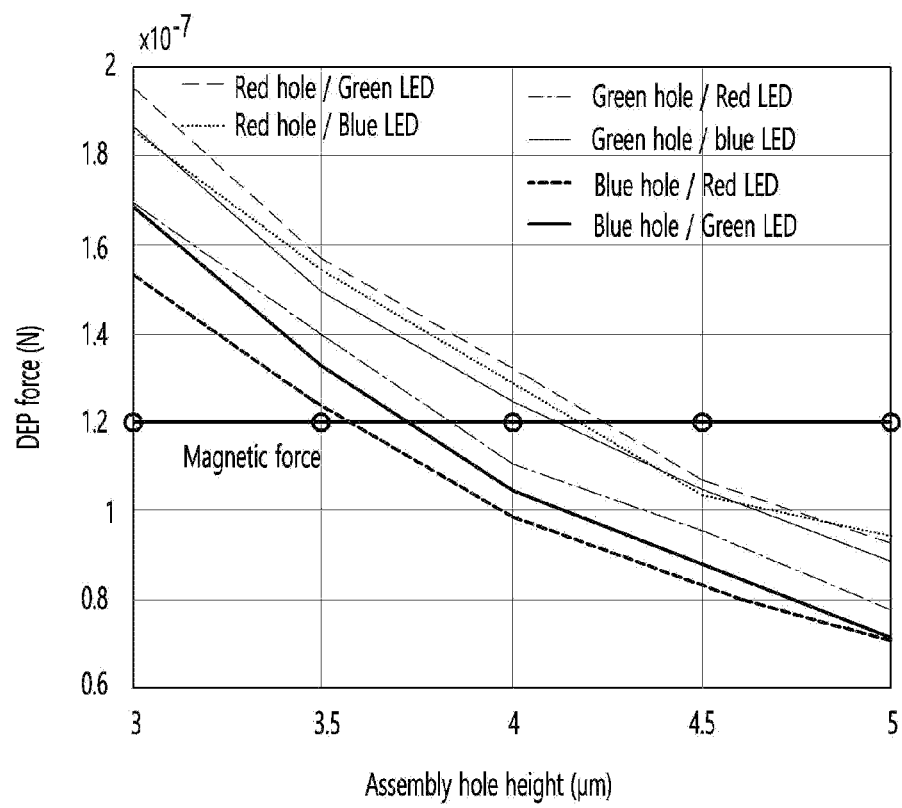

[FIG. 14]
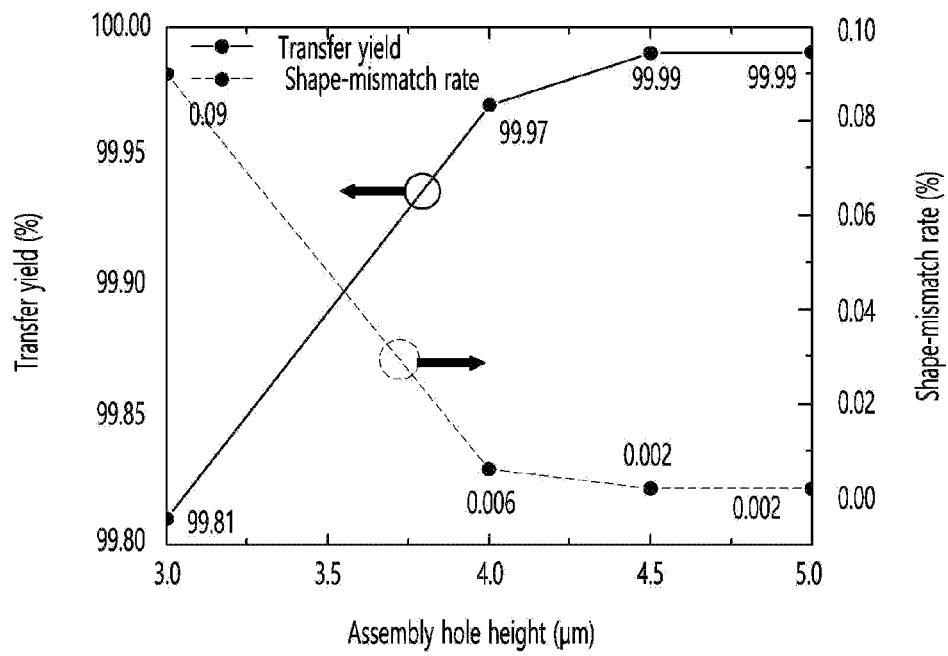
[FIG. 15A]
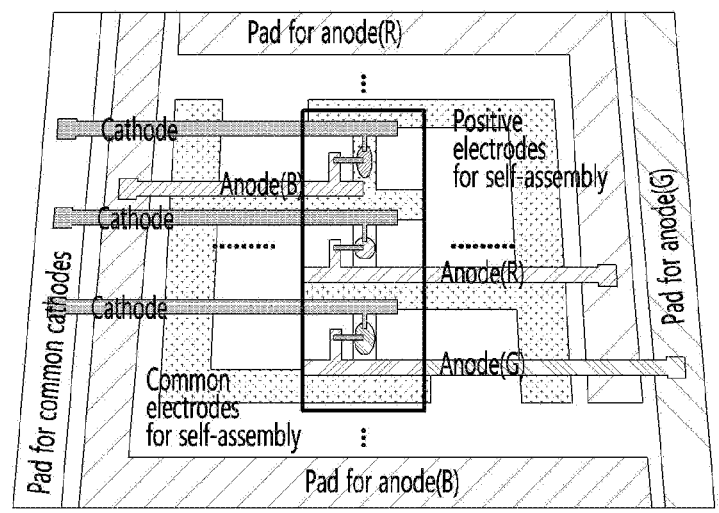

[FIG. 15B]
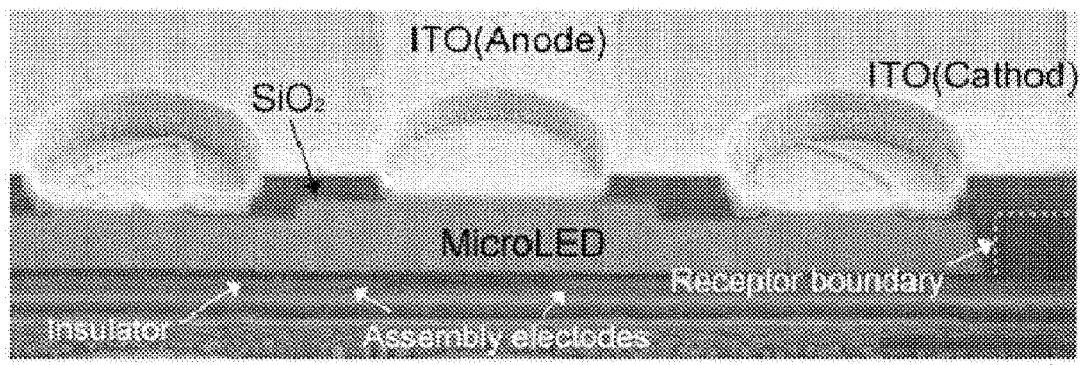
[FIG. 15C]
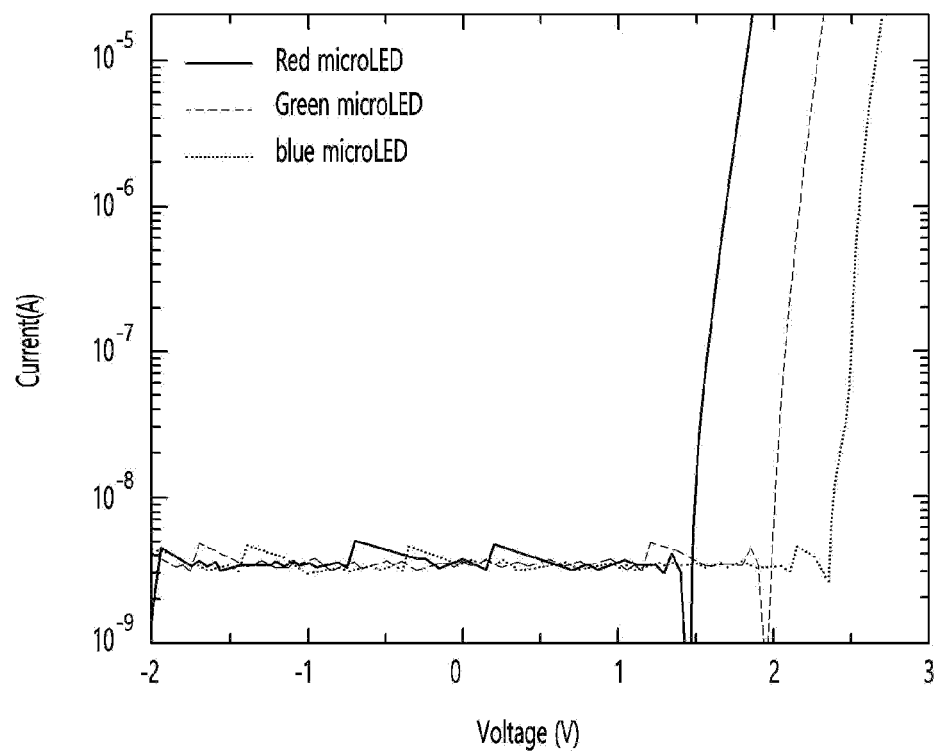

[FIG. 15D]
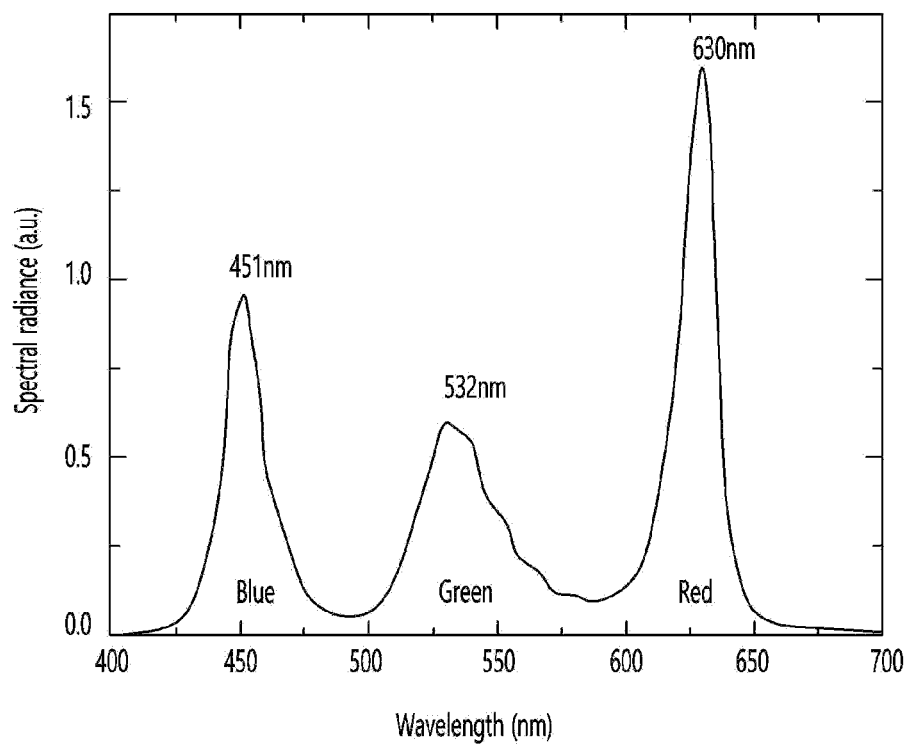
[FIG. 16]
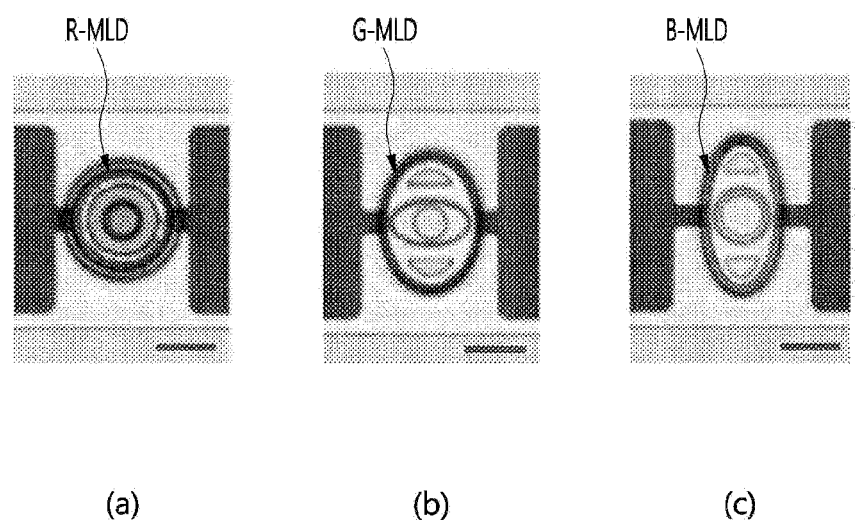
(a)        (b)        (c)

[FIG. 17]
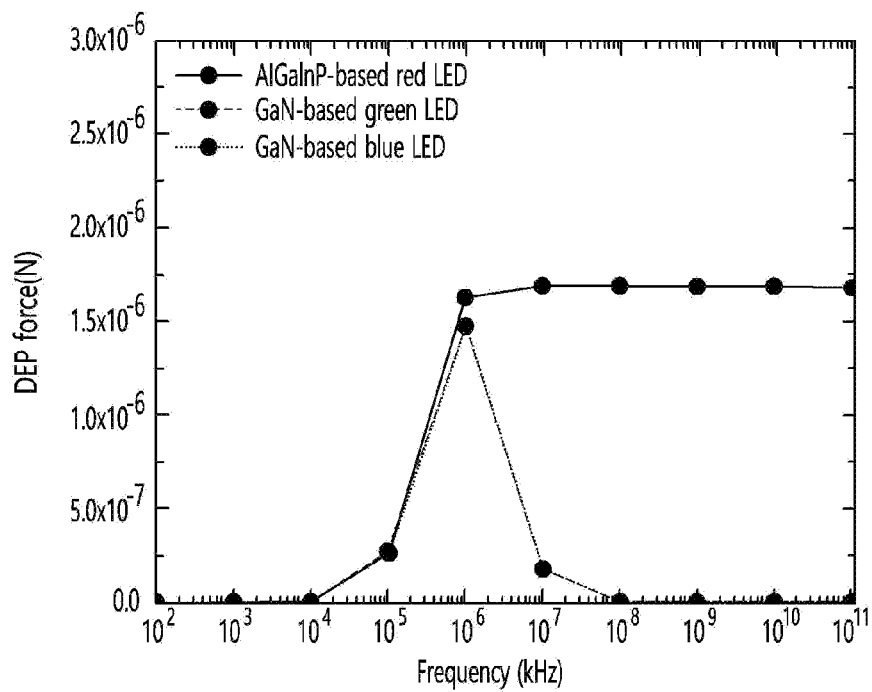
[FIG. 18]
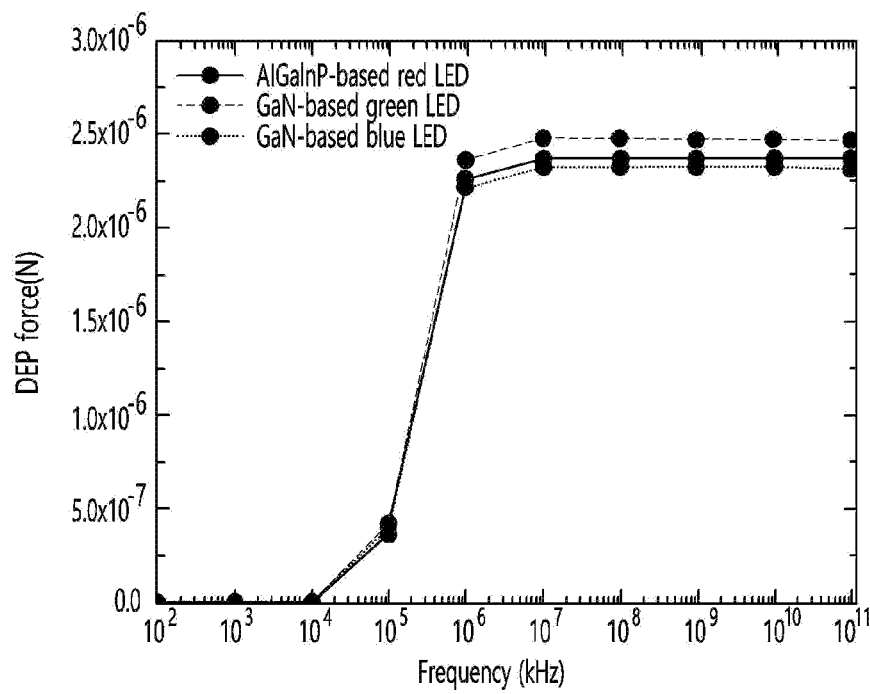

[FIG. 19]
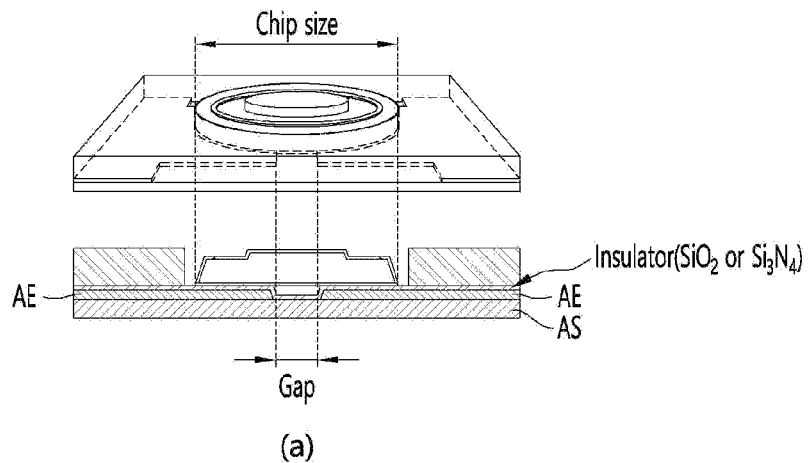
(a)
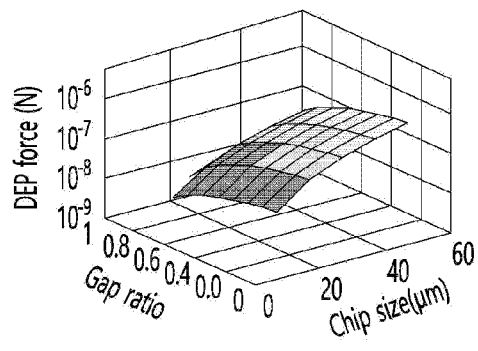
(b)
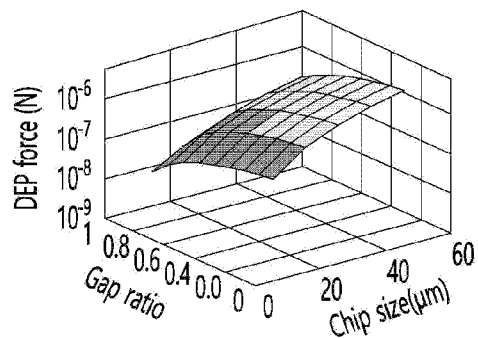
(c)

SEMICONDUCTOR LIGHT EMITTING DEVICE FOR DISPLAY PIXEL AND DISPLAY DEVICE INCLUDING THE SAME

CROSS-REFERENCE TO RELATED APPLICATIONS

The present application claims the benefits of priority to Korean Patent Application No. 10-2022-0090286, filed on Jul. 21, 2022, Korean Patent Application No. 10-2023-0008185, filed on Jan. 19, 2023, all of which are incorporated herein by reference in their entireties.

THE BACKGROUND

1. The Field

The embodiment relates to a semiconductor light emitting device for a display pixel and a display device including the same.

Specifically, the embodiment relates to a simultaneous self-assembly technology of RGB Micro-LEDs for next-generation displays, a semiconductor light emitting device for display pixels applied thereto, and a display device including the same.

2. Description of the Related Art

Micro-LED displays have been in the spotlight as the next-generation displays owing to its various advantages including long lifetime and high brightness compared with organic light-emitting diode displays. As a result, micro-LED technology is being commercialized for large-screen displays such as digital signage, and active R&D programs are being carried out for other applications such as augmented reality, flexible displays, and biological imaging.

However, there are major obstacles in transfer technology of micro-LED, namely high throughput, high yield, and production scalability up to Generation 10+(2940×3370 mm²) glass sizes, and these obstacles need to be overcome in order for micro-LED to enter mainstream product markets and compete with LCD and OLED.

However, advancements in related art have been made in transfer technologies such as stamp method and fluidic self-assembly (FSA), these related art technologies are only suited to serve small volume market with no tangible solutions to address high volume market.

For example, the stamp method of related art has demonstrated transfer of red, blue, and green light emitting diodes (RGB) LEDs to individual RGB sub-pixels.

But, limitations such as poor repeatability and limited stamp size may hinder high transfer throughput. Placement accuracy is another issue. The area of electrical pads and gap between the anode and cathode of a micro-LED for electrical connection is designed in consideration of placement accuracy; therefore, poor placement accuracy may limit the size of the micro-LED.

On the contrary, fluidic self-assembly (FSA) transports micro-sized elements in a fluid, and the micro-sized elements attach to a molten solder and are self-aligned over assembly holes by minimizing of the surface free energy of the liquid solder.

However, the best method for moving the LEDs to the assembly holes has not been identified.

For example, tumbling motion, gravitational force, and shaking motion to transport micro-sized elements were reported, however, they all have a common shortcoming that the transfer yield is not high enough for commercialization.

In addition, unresolved obstacles towards FSA commercialization remain the biggest challenge.

First, a high throughput transfer is needed to address the high-volume consumer market such as TVs. Transfer speed of 50-100 million LEDs per hour has been suggested as a target level in order for micro-LED products to be cost compatible with most consumer applications.

To the best of related art knowledge, the fastest FSA process reported to date is 62,500 chips per 45 seconds, which is equivalent to 5 million chips per hour. Based on this speed it would take as long as 5 hours to assemble a single 4K resolution micro-LED display comprising of 25 million LEDs.

Second, there is a need for scalable technologies for transferring micro-LEDs onto production-size substrates.

Third, technology solution for selective FSA of RGB micro-LEDs must be secured. So far, most studies on micro-LED FSA have been carried out using only mono-color LEDs. Shape-matching FSA technology has been proposed as a potential solution for RGB LED assembly but its feasibility has been demonstrated using just Si elements of sizes larger than 100 μm.

On the other hand, in a technology using a fluid assembly, it is a very important technology to distinguish the chip assembly direction for correct connection between the n-contact and p-contact regions of the LED chip and the lighting wiring.

However, in related technologies, it is not possible to present a technology capable of implementing a micro-LED assembly direction accuracy of 90% or more.

THE SUMMARY

One of the technical objects of the embodiment is to overcome the technical obstacles of the transfer technology to micro-LED technology.

For example, embodiments seek to overcome key obstacles such as high throughput, high yield, and production scalability to 10 generations and beyond (2940×3370 mm²) glass size.

In addition, one of the technical objects of the embodiment is to accurately control the assembly direction of the LED chip in the technology using the fluid assembly.

The technical objects to the embodiments are not limited to those described in this section, but include those understood from the description of the invention.

A semiconductor light emitting device for display pixels according to the embodiments can include a light emitting structure including a first conductivity type semiconductor layer, an active layer, and a second conductivity type semiconductor layer, a first contact electrode electrically connected to the first conductivity type semiconductor layer, a metal layer disposed under the first conductivity-type semiconductor layer, a second contact electrode disposed on the second conductivity type semiconductor layer; and a passivation layer disposed on the light emitting structure.

The metal layer can include a magnetic material, and a weight ratio of the magnetic material to the weight of the semiconductor light emitting device can be 0.25% to 36.75%.

The magnetic material can include Ni.

A thickness of the magnetic material can be 10 nm to 2300 nm.

The first contact electrode can be disposed while surrounding a circumference of the second contact electrode.

Also, an upper side of the light emitting structure can be electrically connected to the first conductivity type semiconductor layer partially removed thereof.

A display device according to the embodiments can include a first assembly electrode and a second assembly electrode spaced apart from each other, a dielectric layer disposed on the first and second assembly electrodes, an insulating layer having an assembly hole and disposed on the dielectric layer and a semiconductor light emitting device disposed on the assembly hole.

The semiconductor light emitting device can be any one of the semiconductor light emitting devices.

A height of the assembly hole can be 4.0 μm or more.

The height of the assembly hole can be 4.5 μm to 5.0 μm.

The dielectric layer can include a nitride.

The dielectric layer can include $Si_3N_4$.

A gap ratio, which is a ratio of a distance ratio between the spaced first and second assembly electrodes to a size of the semiconductor light emitting element, can be 0.4 to 0.8.

Embodiments can present a novel transfer method based on fluidic self-assembly (FSA) technology, named magnetic force-assisted dielectrophoretic self-assembly technology (MDSAT).

MDSAT technology according to embodiments combines magnetic and dielectrophoresis (DEP) forces, so there is special technical effect of achieving a simultaneous RGB LED transfer yield of 99.99% within 15 minutes.

In addition, according to the embodiment, nickel is precisely inserted into the micro-LED, and through this, there is a special technical effect that can precisely control not only the micro-LED movement but also the up and down assembly direction using the magnet.

For example, according to the embodiment, a micro-LED can be effectively moved using magnetic force in a fluid, and a disk-type LED chip having a bottom metal can be assembled using DEP force. Through this, there is a special technical effect that can secure 99.99% assembly accuracy rate (or transfer accuracy rate) that can be mass-produced as a display device by perfectly controlling the assembly direction.

In addition, according to the embodiment, by applying localized DEP force centered around the assembly holes, these micro-LEDs can be effectively captured and assembled in the assembly hole. The assembly hole can be referred as a receptor hole.

Furthermore, according to the embodiment, there is a technical effect in which RGB LEDs can be simultaneously assembled through shape matching between the micro-LED and the assembly hole.

Also, according to the embodiment, a light-emitting panel has been fabricated and it has shown damage-free transfer characteristics and uniform RGB electroluminescence emission, demonstrating the MDSAT method of the embodiment to be an excellent transfer technology candidate for high-volume production of mainstream commercial products.

According to the embodiment, the MDSAT method can utilize a combination of magnetic and dielectrophoresis (DEP) forces to simultaneously transfer RGB LEDs onto a large area substrate at high-speeds where the movement of RGB LEDs to assembly holes in a fluid is accomplished by the magnetic force and the RGB LEDs are trapped and self-aligned within assembly holes by the DEP force such that transfer yield is superior to that of the previous FSA method.

Additionally, according to the embodiment, the MDSAT is a scalable process that can cover glass sizes in today's display production. For example, just by scaling up the size of the magnet array to match that of the glass, the time for the magnet array to cover the glass will remain unchanged. Thus, the assembly time will be insensitive to the transfer area, as well as the number of assembly holes within the glass. This is in sharp contrast to the stamp transfer method, where the process time scales up linearly with transfer area.

By controlling the assembly condition, assembly holy design, and shape matching, a transfer yield of 99.99% has been achieved for RGB LEDs, which is adequate to realize defect-free 4K resolution displays when used in conjunction with redundancy pixel architecture. Therefore, it is considered that the MDSAT technology of the embodiment is an ideal micro-LED transfer technology for mass production of next-generation commercial products.

The technical effects of the embodiments are not limited to those described in this section, but include those understood from the description of the invention.

BRIEF DESCRIPTION OF THE DRAWINGS

FIG. 1A schematically depicts a Magnetic force-assisted Dielectrophoretic Self-Assembly Technology (MDSAT) method according to an embodiment.

FIG. 1B is data of DEP and magnetic force distribution between two adjacent assembly holes AH.

FIG. 2 is a diagram illustrating a relationship between a DEP force according to an inclination angle of a surface of an assembly substrate AS of a micro-LED at a surface of an assembly hole AH in the embodiment.

FIG. 3 is an example of a micro-LED device according to the embodiment.

FIG. 4 is simulation result data of the DEP force vector for the assembly angle (0-180°) relative to the assembly hole surface for various micro-LEDs.

FIGS. 5 to 7 are behaviors of monochromatic micro-LEDs near an assembly hole AH.

FIG. 8A is transfer yield data related to DEP force and magnetic force.

FIG. 8B is transfer yield data related to the thickness and magnetic force of the bottom metal.

FIG. 8C is forward and reverse DEP force comparison data according to the presence or absence of the lower metal layer on the LED chip.

FIG. 9 is a diagram showing assembled states of micro-LEDs according to the relationship between magnetic force and DEP force.

FIG. 10 is experimental result data for evaluating the reproducibility of transfer yield.

FIG. 11 is an image of three examples of shape mismatch defects.

FIG. 12 is a schematic diagram showing the inclination angle between micro-LEDs and assembly holes that do not match in shape.

FIG. 13 is data for DEP forces for shape-matching micro-LEDs as a function of assembly hole height.

FIG. 14 is data of transfer yield as a function of assembly hole height in an example.

FIG. 15A is a schematic diagram of a PM panel showing red, green and blue LEDs and interconnections between LEDs and pads.

FIG. 15B is a cross-sectional view of an RGB panel.

FIG. 15C is a diagram showing I-V characteristics of red, green, and blue.

FIG. 15D is EL spectrum data showing emission peaks at 451 nm, 532 nm and 630 nm, respectively.

FIG. 16 is a microscope image of an RGB micro-LED according to an embodiment.

FIG. 17 is the change data of the DEP force according to the frequency.

FIG. 18 shows data of DEP force change with frequency using RGB micro-LEDs with a bottom metal layer.

FIG. 19 is a schematic diagram of a 3D model for COMSOL simulation.

THE DETAILED DESCRIPTION

Hereinafter, the embodiments disclosed in the present specification will be described in detail with reference to the accompanying drawings. The suffixes "module" and "part" for components used in the following description are given or mixed in consideration of only the ease of writing the specification, and do not have a meaning or role distinct from each other by themselves. In addition, the accompanying drawings are provided for easy understanding of the embodiments disclosed in the present specification, and the technical spirit disclosed in the present specification is not limited by the accompanying drawings. Also, when an element, such as a layer, region, or substrate, is referred to as being 'on' another element, this includes that it is directly on the other element or there can be other intermediate elements in between.

The display device described in this specification may include a mobile phone, a smart phone, a laptop computer, terminals for digital broadcasting, a PDA (personal digital assistants), a PMP (portable multimedia player), a navigation, a Slate PC, a Tablet PC, an Ultrabook, a Digital TV, a Desktop Computer, etc. However, the configuration according to the embodiment described in the present specification can be applied to a display capable device even if it is a new product form to be developed later.

Hereinafter, a light emitting device for a display pixel and a display device including the light emitting device according to the embodiment will be described.

FIG. 1A is a schematically depicted drawing for the MDSAT (Magnetic force-assisted Dielectrophoretic Self-Assembly Technology) method according to the embodiment.

FIG. 1A shows the micro-LEDs MLD and assembly substrate AS placed in a bath chamber with deionized water as the fluidic medium FM.

An assembly substrate AS and the micro-LEDs can be placed in a bath chamber, and a cluster of micro-LEDs can be formed by the axial rotational motions of magnetic array MA beneath the assembly substrate AS as illustrated in the inset. The magnetic array MA can move in the direction shown by the arrows while maintaining their axial rotational motions.

A magnetic array MA can be placed along a backside of the assembly substrate AS to apply a magnetic force on a ferromagnetic material (for example, nickel) embedded micro-LEDs MLD. The magnetic array MA can include a plurality of circular magnetic rod arrays, but the embodiment is not limited thereto. The fabrication of the micro-LEDs will be described in later.

In FIG. 1A, the micro-LED MLD is illustrated as being disposed on an upper side of the assembly substrate AS, but the embodiment is not limited thereto. For example, the micro-LED MLD can be disposed below the assembly substrate AS.

Referring to FIG. 1A, initially, each magnet rod of magnetic array MA can be provided an axial rotational motion such that innumerable micro-LEDs can be clustered around it and subsequently, the magnetic arrays MA is moved in X direction and Y direction to scan the entire area of the assembly substrate AS.

As illustrated in FIG. 1A, the micro-LED cluster can move in response to the magnetic force of magnetic arrays MA and as the micro-LED cluster nears the assembly hole AH, each micro-LED from this cluster can be trapped in each assembly hole AH by the DEP force.

Next, FIG. 1B shows the distributions of the DEP and magnetic forces between two adjacent assembly regions.

The essential magnetic and DEP forces are respectively depicted by dotted and solid lines, respectively, and the schematic located in the background of the graph indicates the positions where the magnetic and DEP forces are calculated.

The DEP force according to the embodiment can exceed the magnetic force by about 10 times and can control the eventual assembly process.

However, according to the embodiment, as DEP is a short-range force, it is effective around the assembly hole AH.

Contrastingly, magnetic forces can act over long ranges and help with transport of micro-LEDs across the assembly substrate AS.

FIG. 2 is an exemplary view of the relationship between the DEP force according to the inclination angle on the surface of the assembly board AS of the micro-LED at the surface of the assembly hole AH in the embodiment.

According to the embodiment, various movements of micro-LEDs caused by the DEP force by assembly electrode AE have been investigated as micro-LEDs approach the assembly hole AH at various angles relative to the assembly surface AS.

Referring to FIG. 2, in the cross-sectional view (upper left) of the 3D model with an angle range of 0-90°, the metal layer B-metal on the back of the micro-LED moves in the direction of the assembly electrode AE.

On the other hand, in the cross-sectional view of the 3D model (upper right) in the angle range of 90~180°, as the angle of the graph increases within 90~180°, the passivation layer PV on top of the micro-LED moves toward the assembly electrode AE.

FIG. 3 is exemplary views of a micro-LED device according to an embodiment.

For example, FIG. 3(a) is an exemplary view of a Blue or Green micro-LED device according to the first embodiment.

The blue or green micro-LED device according to the first embodiment can include undoped GaN (n-GaN), n-type GaN (n-GaN), an active layer (not shown), and p-type GaN (p-GaN).

In addition, the blue or green micro-LED device according to the first embodiment can include a bottom metal (B-metal) under undoped GaN (u-GaN) and an n-type contact electrode (n-contact) on n-type GaN (n-GaN), a p-type contact electrode (p-contact) on p-type GaN (p-GaN) and passivation (PV). Also, the n-type contact electrode (n-contact) and the passivation (PV) can be spaced apart by a predetermined distance S.

The Blue or Green micro-LED device according to the first embodiment can be a GaN-based disk, and the bottom metal (B-metal) can include Ti, but is not limited thereto.

Also, the p-type contact electrode (p-contact) can be formed of ITO, but is not limited thereto.

Also, the n-type contact electrode (n-contact) can be formed of a single layer or a plural layer of Cr, Ti, and Ni.

Also, in the first embodiment, a thickness of undoped GaN (u-GaN) can be about 3.0 to 4.0 μm. In addition, a thickness of n-type GaN (n-GaN) can about 3.0 to 4.0 µm. In addition, a thickness of p-type GaN (p-GaN) can be about 0.2 to 1.0 µm. Also, a thickness of the bottom metal (B-metal) can about 50 to 200 nm. The passivation (PV) can include Sift and can have a thickness of about 300 to 800 nm.

Next, FIG. 3(b) is an exemplary view of the red micro-LED device according to the second embodiment.

Red micro-LED device according to the second embodiment can include n-type GaInP (n-GaInP), n-type GaAs (n-GaAs), n-type AlInP (n-AlInP), active layer (not shown), p-type GaP (p-GaP).

In addition, the red micro-LED device according to the second embodiment can include a bottom metal (B-metal) under n-type GaInP (n-GaInP), an n-type contact electrode (n-contact) on n-type AlInP (n-AlInP), a p-type contact electrode (p-contact) on p-type GaP (p-GaP) and passivation PV. The n-type contact electrode (n-contact) and the passivation PV can be separated by a predetermined distance S.

The red micro-LED device according to the second embodiment can be a GaAs-based disk, and the bottom metal (B-metal) can include Ti, but is not limited thereto.

In addition, the n-type contact electrode (n-contact) can be formed of a single layer or a plural layer of Au, AuGe, Ti, or Ni.

In addition, the p-type contact electrode (p-contact) can be formed of ITO, but is not limited thereto.

Also, in the second embodiment, a thickness of n-type GaInP (n-GaInP) can be about 0.1 to 0.5 µm. In addition, a thickness of n-type GaAs (n-GaAs) can be about 0.02 to 0.10 µm. In addition, a thickness of the n-type AlInP (n-AlInP) can be about 3.0 to 5.0 µm. In addition, a thickness of p-type GaP (p-GaP) can be 0.5 to 1.5 µm.

A thickness of the bottom metal (B-metal) can be about 50 to 200 nm. The passivation PV can include $SiO_2$ and can have a thickness of about 300 to 800 nm.

FIG. 4 shows the simulation results of the DEP force vectors for various micro-LED assembly angles (0-180°) relative to the assembly hole surface.

According to the embodiment, COMSOL simulation using the Finite Element Method approach has been conducted to study the DEP force between a micro-LED and the assembly hole AH by integrating the Maxwell stress tensor over the surface of a micro-LED.

When particle's induced dipoles interact with a nonuniform electric field, the DEP force affects the particle to move. Information on the movement direction of the particle is given by the sign of the Clausius-Mossotti (CM) factor; when this factor is positive or negative, the particle is correspondingly attracted to or repelled from the electric field strength maximum.

Referring back to FIG. 2, FIG. 2 shows the Z-axis components of the DEP force vectors in the direction of the assembly electrodes AE, and cross-sectional views depicting the position of micro-LED for angles 0-90° and 90-180° are given in the inset.

FIG. 2 shows that the DEP force increases with a decreasing angle, indicating that a micro-LED is pulled to the assembly hole AH as the angle decreases and eventually gets assembled when the angle is less than 10°, when the DEP force dominates the magnetic force.

Axial rotation of the magnets in the proposed MDSAT method, which induces a wobbling motion of the micro-LEDs, is expected to increase the chance of a micro-LED meeting this angle criteria for assembly.

However, when the angle is beyond 60° the DEP force fluctuates around zero before it turns clearly negative after 165°. This indicates that micro-LED will likely be pushed away from the assembly hole at angles above 60°, especially in the presence of an external magnetic force.

This unique behavior is attributed to the design of the micro-LED, which exhibits higher conductivity on the bottom side because of the intentionally coated bottom metal (B-metal) layer.

To experimentally verify the simulation result, the behavior of the mono-color micro-LED (GaN-based disk of diameter 38 µm), near assembly holes was monitored using a super-high-speed camera.

From the recorded video, it has been observed three distinct stages during assembly as FIG. 5 (stage 1), FIG. 6 (stage 2), and FIG. 7 (stage 3), respectively.

First, FIG. 5 shows the stage 1 in which micro-LEDs are gathered around an assembly hole AH in response to the movement of magnetic force. The micro-LED closest to the assembly hole AH reacts to the emerging DEP force and its edge adjoins the perimeter of the assembly hole.

Next, FIG. 6 shows the stage 2 in which the micro-LED wobbles along the edge of the assembly hole AH in response to the rotational motion of the magnet. This indicates that it is in a transition state that is balanced between DEP and magnetic force.

Finally, FIG. 7 shows that the micro-LED is assembled as the angle between the micro-LED and the assembly hole AH falls below a specific angle.

Based on the stated behavior of micro-LEDs in the assembly hole, the transfer yield has been studied as the applied peak-to-peak voltage ($V_{pp}$) related to DEP is varied.

Next, FIG. 8A shows the transfer yield experimentally obtained along with the DEP force and magnetic forces calculated from the COMSOL simulations.

The magnetic force was calculated at 10 locations around a assembly hole, resulting in a range of $1 \times 10^{-8}$ [N]~$1.2 \times 10^{-7}$ [N]. The size of the assembly substrate was about 75 mm×75 mm and 270×240 pixels. The assembly substrate consisted of about 64,800 assembly holes, placed about 278 µm apart from each other.

As shown in FIG. 8A, the transfer yield initially increases with increasing $V_{pp}$ to a maximum point, after which it starts to drop. This phenomenon deviates from our intuitive prediction that the yield will improve as the DEP force, which is controlled by $V_{pp}$, increases.

To explain such behavior, images at assembly sites were taken by the CCD camera, and image analysis was carried out. Based on the image analysis, defects such as unassembled sites and multiple micro-LEDs within one assembly hole were found, which reduces transfer yield.

Next, FIG. 8B is transfer yield data related to the thickness and magnetic force of the bottom metal.

Referring to FIGS. 8A and 8B, the micro-LED can be effectively moved using magnetic force in the fluid, and the disk-shaped LED chip with the bottom metal is assembled using DEP force to perfectly control the assembly direction, thereby there is a special technical effect that assembling rate or transfer rate can be secured up to 99.99%.

Next, FIG. 8C is forward and reverse DEP force comparison data according to the presence or absence of the lower metal layer on the LED chip.

Referring to FIG. 8C, the LED chip (LED_E) according to the embodiment can include a lower metal under the chip. On the other hand, the LED (LED_R) according to the comparative example may not have a lower metal under the chip.

When a reverse electric force is applied to the LED chip (LED_E) according to the embodiment and the LED (LED_R) according to the comparative example, a repulsive force may be applied to the chip, and accordingly, the LED chip may move away from the assembly hole.

On the other hand, when a forward electric force is applied to the LED chip (LED_E) according to the embodiment and the LED (LED_R) according to the comparative example, attractive forces may be applied to the chips, and accordingly, the LED chips may be assembled in the assembly hole.

Since the semiconductor light emitting device according to the embodiment includes a backside metal layer, it is more advantageous to perfectly control the assembling direction of the top side and bottom side.

For example, according to the embodiment, there is a technical effect in that the DEP force during forward assembly can be significantly increased by 50% or more compared to the DEP force during reverse assembly.

For example, referring to FIG. 8C, the LED chip (LED_E) according to the embodiment may have a bottom metal, and the difference ($\Delta$DEP_E) between the DEP force when reverse electric force is applied and the DEP force when 7V forward electric force is applied may be about $3.0\times10^{-6}$ [N].

On the other hand, in the LED chip (LED_R) according to the comparative example, the difference ($\Delta$DEP_R) between the DEP force when reverse electric force is applied and the DEP force when 7V forward electric force is applied may be about $2.0\times10^{-6}$ [N].

Accordingly, since the semiconductor light emitting device according to the embodiment includes a bottom metal layer, it is more advantageous to distinguish the top and bottom of the chip, and accordingly, there is a special technical effect of perfectly controlling the assembly direction.

Next, Table 1 below is data of the thickness, weight, and ratio of Ni according to the strength of the magnet in the embodiment.

A semiconductor light emitting device according to an embodiment may include a bottom metal layer, and the bottom metal layer may include a magnetic material. For example, the embodiment may include Ni as the metal layer, but is not limited thereto.

of the GaN-based LED may be 220 nm, and the electrode gap may be about 7.5 μm, but is not limited thereto.

According to the embodiment, the DEP force may be about 10 times greater than the magnetic force, for example, about 12 times greater. For example, according to the embodiment, the DEP force may be about 1.47E-6 [N] (FIG. 1B), and the magnetic force may be about 1.2E-7 [N], but is not limited thereto.

FIGS. 9(a) to 9(c) are diagrams showing assembled states of micro-LEDs according to the relationship between magnetic force and DEP force. And FIG. 10 is experimental result data for evaluating reproducibility of transfer yield.

According to FIG. 9(a), the image analysis showed that during the early stage when magnetic force dominates the DEP force. For example, the micro-LEDs settled in assembly holes were swept away by the movement of magnets, resulting in unassembled sites as shown FIG. 9(a).

Next, as shown FIG. 9(b), as $V_{pp}$ and DEP force increase to levels above magnetic force, the empty assembly holes gradually get filled by micro-LEDs and remain stable.

As shown FIG. 9(c), after reaching 12 $V_{pp}$, the transfer yield started to decrease. The decrease is attributed to a defect in which multiple micro-LEDs MLD1, MLD2 were placed around one assembly hole.

After a micro-LED gets assembled into the assembly hole AH, a gap between the micro-LED and assembly hole wall can be created due to their design tolerance. A certain level of DEP force inherently emerges via this gap and when this DEP force becomes strong enough at high $V_{pp}$, it leads to capture of other nearby micro-LEDs. In order to evaluate the reproducibility of the transfer yield, experiment was repeated 15 times under the optimal voltage (12 $V_{pp}$), and the results are provided in FIG. 10.

Concurrent self-assembly of RGB micro-LEDs according to the embodiments demonstrated that high assembly yields can be attained using the proposed MDSAT method.

The assembly holes were shape matched to their respective RGB micro-LEDs, and the hole size of the assembly holes was designed 4 μm larger than that of the LEDs in both axes directions.

TABLE 1

| Strength of magnet | N/A | N/A | 500 mT | 430 mT | 250 mT |
|---|---|---|---|---|---|
| Thickness of Ni | 10 nm | 20 nm | 50 nm | 83 nm | 2300 nm |
| Weight of Ni | 6.46E−11[g] | 1.29E−10[g] | 1.9E−10[g] | 5.36E−10[g] | 1.48E−8[g] |
| Weight of chip | | | 2.564E−8 [g] | | |
| Ratio of N | 0.25% | 0.5% | 0.75% | 2.05% | 36.75% |

Table 1 shows the thickness of Ni to have a magnetic force of about 1.2E-7 [N] (see FIG. 1B) according to the strength of the magnet and the change data of the ratio of Ni accordingly.

For example, the magnetic force used for assembling a 38 μm class DSAT in the embodiment may be about 1.2E-7 [N]. According to the embodiment, the ratio of Ni in the semiconductor light emitting device chip may be about 0.25% to 36.75%.

Experimental conditions in the embodiment may employ a 430 mT Neodymium magnet having a size of 12$V_{pp}$, a frequency of 100 kHz, and a size of 2 mm×20 mm, and the distance between the micro-LED and the magnet may be about 504.78 μm. The thickness of the glass may be about 500 μm, and the thickness of the electrode and passivation may be about 0.28 μm. The height of the assembly hole may be about 4.5 μm, the thickness of the magnetic material (Ni)

For example, Red micro-LED (R-MLD) is 42 μm in diameter, Green micro-LED (G-MLD) is 49 μm×35 μm in diameter, and Blue micro-LED (B-MLD) is 56 μm×28 μm in diameter.

Based on this design, an assembly yield of 99.81% was obtained.

The shape-mismatch defects have a total of six combinations: a red micro-LED settled within a green or a blue assembly hole, a green micro-LED settled within a red or a blue assembly hole, and a blue micro-LED settled within a red or a green assembly hole.

FIG. 11 is microscope images of three examples of the shape-mismatch defects.

FIG. 11 shows that a red micro-LED (R-MLD) is settled within a green assembly hole (G-AH), a green micro-LED (G-MLD) is settled within a red assembly hole (R-AH), and a blue micro-LED (B-MLD) is settled within a green assembly hole (G-AH) respectively. The anode and the cathode are also indicated.

FIG. 12 is a drawing schematically showing the inclination angle between a shape mismatched micro-LED and the assembly hole.

A close inspection of the defects revealed that the micro-LEDs were assembled in a tilted manner, where one side of a micro-LED was positioned at the bottom corner of the assembly hole while the other diagonal side was settled on top of the assembly hole, as illustrated in FIG. 12.

As illustrated in FIG. 12, Here $\theta_i$ can be defined as the inclination angle between the LED and the assembly hole.

FIG. 13 is a plot of data for DEP force for shape-matching micro-LEDs as a function of assembly hole height.

To investigate these shape-mismatch defects in detail, a quantitative analysis of the DEP force at various $\theta_i$ as a function of the assembly hole height, for all six combination cases of shape-mismatch, has been conducted as shown in FIG. 13.

The maximum value of magnetic force acting on a micro-LED was calculated as $1.2 \times 10^{-7}$ [N] based on COMSOL simulation and is reflected in the plot.

As the assembly hole height increases from 3 μm to 5 μm, $\theta_i$ increases, and as a result, DEP force exerted on the LED decreases.

When the hole height increases above 4.3 μm, DEP level falls below that of magnetic force for all 6 variations of shape-mismatch cases.

This implies that when the hole height is above 4.3 μm, a defectively assembled LED has a good probability to get detached in response to the movement of a magnet. This process will continue until a proper shape-matched LED is attained, at which time $\theta_i$ is near zero and micro-LED will be difficult to detach. This finding offers crucial insight suggesting that an increase in hole height can enhance self-repair of shape-mismatch defects.

FIG. 14 is data of transfer yield as a function of assembly hole height in an embodiment.

With this understanding, the transfer yield was examined as a function of the assembly hole height ranging from 3 μm to 5 μm, and the results are shown in FIG. 14.

The size of the assembly substrate was 75 mm×75 mm and consisted of 64,800 RGB assembly holes, placed 278 μm apart from each other.

A magnet head of the same size as the substrate consisted of an 8×8 array of magnets, with each magnet designed to synchronously scan over an area of 13 mm×13 mm in 15 minutes.

Each neodymium magnet rod (diameter: 5 mm, length: 20 mm) has a magnetic field strength of 5000 gauss. The magnetic array can move at 250 μm/s in both x and y directions while rotating axially at 420 revolutions/min.

According to FIG. 14, the transfer yield dramatically improved with increasing assembly hole height as a result of the decrease in shape-mismatch defects. By raising the hole height from 3 μm to 4 μm, the transfer yield and defect rate sharply improved and when the hole height reached 4.5 μm and μm, a transfer yield as high as 99.99% was achieved.

To the best known, this is the first study demonstrating concurrent transfer of RGB micro-LEDs, with the highest transfer yield for FSA technology, irrespective of the type and size of the assembled element.

Also, in an embodiment, a 100 mm×100 mm RGB micro-LED display panel has been fabricated using the MDSAT method. A previous study reported on the realization of micro-LED display based on FSA, but it was based on mono-color LEDs.

The panel according to the embodiment includes 43,200 micro-LEDs corresponding to a display resolution of 120× 120 pixels and a pixel pitch of 834 μm.

FIG. 15A is a schematic diagram of a PM panel showing red, green, and blue LEDs and interconnections between LEDs and pads.

Also, FIG. 15B is a cross-sectional view of an RGB panel.

For example, FIG. 15B shows a focused ion beam (FIB) image of a cross-sectional view of a PM panel showing two coplanar assembly electrodes, a micro-LED in an assembly hole, a planarization layer, and a power line.

Assembled holes can be indicated by white dotted lines because assembled holes appear faint due to the similar contrast between the organic materials.

A spray process was carried out to fix the micro-LEDs after self-assembly. Then, planarization was conducted, and contact holes to connect power lines and pads for anodes and common electrodes were fabricated. A cross-sectional view of the RGB panel showing these constituent components is depicted in FIG. 15B.

Next, FIG. 15C shows the I-V characteristics of the red, green, and blue micro-LEDs.

For example, FIG. 15C shows the I-V characteristics of the red, green, and blue micro-LEDs with forward voltages of 1.83, 2.3, and 2.65 V, respectively, at 10 μA and a leakage current of less than 10 nA.

New, FIG. 15D provides EL spectrum, showing clearly defined emission peaks at 451 nm, 532 nm, and 630 nm, respectively.

According to embodiments, the electroluminescence (EL) emissions of the RGB panel can have excellent emission intensity and brightness uniformity, and can realize 3×3 pixels clearly emitting in red, green, and blue colors.

In terms of pixel yield, the panel exhibited 10 defective pixels, representing an emission pixel yield of 99.98%.

The scalable MDSAT method can be potentially integrated with conventional active-matrix (AM) backplanes by scaling the magnet array size accordingly.

For a large-area glass, the RC delay from increased wiring of the assembly electrodes should be considered; however, this delay can be overcome with a circuit structure with multiple pads to apply an AC voltage on a block-by-block basis.

When the MDSAT method is integrated with conventional AM backplanes, the RGB micro-LEDs can be deposited over a transistor backplane with a top emission structure. The anodes of the micro-LEDs can then be connected to the driving circuits on the AM backplane, while the cathodes are connected together.

Example 1

RGB LEDs: Difference in the DEP Force Between AlGaInP-Based and GaN-Based LEDs

Recently, there has been a steady increase in studies investigating the self-assembly of micro-components such as LEDs, III-V devices, and nanowires using DEP force. In this section, a comparison of the DEP force on individual RGB micro-LEDs was conducted. 3D models of the micro-LEDs were constructed using COMSOL and used to calculate the DEP force on an AlGaInP-based LED for red and GaN-based LEDs for blue and green colors. Table 2 lists the materials, permittivity, and conductivity as input parameters of COMSOL; thin layers of multi-quantum well (MQW) are not included in COMSOL simulations because their effects on the results are expected to be minimal.

TABLE 2

| Parameters | Layer 1 | Layer 2 | Layer 3 | Layer 4 |
|---|---|---|---|---|
| Red | | | | |
| Material | p-GaP | n-AlInP | n-GaAs | n-GaInP |
| Relative Permittivity ($\varepsilon$) | 11.1 | 11.25 | 12.9 | 11.8 |
| Electrical Conductivity (S/m) | 2,500 | 3,200 | 64,000 | 8,000 |
| Green, Blue | | | | |
| Material | p-GaN | n-GaN | u-GaN | |
| Relative Permittivity ($\varepsilon$) | 8.9 | 8.9 | 5.9 | |
| Electrical Conductivity (S/m) | 0.00238 | 20,000 | 0.002 | |

MDSAT has another key potential to concurrently assemble RGB micro-LEDs by shape matching the RGB LEDs with their respective assembly holes. Differentiating the shape of micro-LEDs and assembly holes allows for a one-step transfer of RGB LEDs in a single chamber, which in turn offers benefits such as simple system design, reduced investment, and minimized process cost.

In this work, a circular shape was chosen for the red micro-LED, and two different elliptical shapes were used for the green and blue micro-LEDs, where the long and short axes lengths of ellipsoids differed.

The reasons for choosing one circular shape and two elliptical shapes were as follows.

In the MDSAT method, self-assembly takes place in a stochastic manner, so innumerable micro-LEDs are randomly distributed in a turbulent fluid caused by the magnetic force of rotating magnets.

Therefore, the random motions of the innumerable micro-LEDs overcome dependence of rotational symmetry on self-assembly, resulting in no difference in assembly yield between circular and elliptical shapes.

Furthermore, circular and elliptical shapes are resistant to damages caused by LED-to-LED collisions owing to their round shapes, compared to shapes with corners (e.g. triangle, square, or rectangular).

For the dimensions of the circular-shaped red micro-LED, two factors were considered: the design rule (tolerance for fabricating one anode (p-contact) and two cathodes (n-contact) on top of a single micro-LED) and separation between the Ni metal and edge of the micro-LED.

In this work, the design rule was set to 7 µm, which means that 35 µm is required for the three areas for the three contacts and two spaces S between the contacts. The purpose of the separation S was to eliminate the formation of LED-to-LED chains owing to magnetization after magnetic manipulation, as illustrated in FIGS. 3A and 3B.

FIG. 16 is a microscope image of an RGB micro-LED according to an embodiment.

For example, FIG. 16(a) is an image of an AlGaInP-based red LED having a micro-LED size of 38 µm in diameter. Also, FIG. 16(b) is an image of a GaN-based green LED having a micro-LED size of 45 µm×31 µm. In addition, FIG. 16(c) is an image of a GaN-based blue LED having a micro-LED size of 52 µm×24 µm. (Scale bar is 20 µm)

As shown in FIG. 16(a), the separation S was set to 1.5 µm on both sides (left and right) of the micro-LED. Therefore, the diameter of the red micro-LED (R-MLD) was established as 38 µm by considering the design rule (35 µm) and two separations (3 µm).

Next, the elliptical shape of the green micro-LED (G-MLD) was designed to be 45 µm×31 µm, as shown in FIG. 16(b). The long and short axes were respectively 7 µm larger and 7 µm smaller than the 38 µm diameter of the circular-shaped red micro-LED. The 45 µm long axis was determined according to process tolerance, which was based on the photolithography and etching steps used to fabricate the micro-LEDs and assembly holes. The assembly hole diameter of the circular-shaped red micro-LED was 42 µm, and the process tolerance was 3 µm. As a result, the long axis of the green micro-LED was chosen to be 45 µm such that the green micro-LED is not trapped in the circular-shaped hole of the red micro-LED.

Next, the elliptical shape of the blue micro-LED (B-MLD) was designed in the same way that the green micro-LED was determined. The long and short axes were respectively 7 µm larger and 7 µm smaller than the 45 µm×31 µm of the green micro-LED. As a result, the elliptical shape of the blue micro-LED (B-MLD) was designed to be 52 µm×24 µm, shown in FIG. 16(c).

Next, FIGS. 17 and 18 are data related to DEP force of COMSOL simulation.

For example, FIG. 17 is data on the change of DEP force with frequency at a fixed value of applied voltage (12 Vpp).

FIG. 18 is the data of the DEP force change with frequency at a fixed value (12 Vpp) of the applied voltage using a modified RGB micro-LED with a bottom metal layer on the bottom surface.

In detail, FIG. 17 shows the change in the DEP force of the RGB micro-LEDs with frequency, where the applied voltage and gap between two assembly electrodes are fixed at 12 $V_{pp}$ and 7.5 µm, respectively; this was found to be the optimal condition used for the fabrication of our display panels.

Furthermore, the three LEDs experience the highest DEP force at around 100 kHz.

However, the DEP force decreases beyond 100 kHz in the case of the GaN-based LEDs, while the AlGaInP-based LED maintains the DEP force. Under this condition, all three LEDs cannot be simultaneously assembled at high yields because of the different frequency responses in DEP force.

Since the DEP force is exerted on a polarizable particle in a non-uniform electric field, it is affected by the electric field magnitude, frequency of input voltage, permittivity and conductivity of a particle (i.e., micro-LED), and particle size (i.e., micro-LED chip size).

(The effects of the LED chip size and electric field magnitude on the DEP force will be provided in Example 2)

The difference in frequency response is attributed to the difference in conductivity between layer 4 of the AlGaInP-based and layer 3 of GaN-based LEDs, which is given in Table 2.

This can be explained by the CM factor, which is a function of frequency with both dielectric ($\varepsilon_0\varepsilon_r$) and conductive contribution ($\sigma$).

At high frequencies, the particle permittivity is dominant factor, whereas the particle conductivity is dominant at low frequencies which is in the range used in this embodiment.

Hence, the difference in DEP forces between the GaN-based LEDs and AlGaInP-based LEDs can be explained by the difference in their conductivities.

To overcome the conductivity difference, a titanium bottom metal layer, whose conductivity is provided in Table 3, was added to the LED bottom surface, and the resulting DEP force response to frequency is illustrated in FIG. 18.

The diameter of the micro-LED can be 10~50 μm to evaluate the effect of the LED chip size on the DEP force.

TABLE 3

| Parameters | Layer 1 | Layer2 | Layer3 | Layer 4 | Layer 5 |
|---|---|---|---|---|---|
| Red | | | | | |
| Material | p-GaP | n-AlInP | n-GaAs | n-GaInP | Ti |
| Relative Permittivity (ε) | 11.1 | 11.25 | 12.9 | 11.8 | 1 |
| Electrical Conductivity (S/m) | 2,500 | 3,200 | 64,000 | 8,000 | $1.8 \times 10^6$ |
| Green, Blue | | | | | |
| Material | p-GaN | n-GaN | u-GaN | Ti | |
| Relative Permittivity (ε) | 8.9 | 8.9 | 8.9 | 1 | |
| Electrical Conductivity (S/m) | 0.00238 | 20,000 | 0.002 | $1.8 \times 10^6$ | |

The structures of micro-LEDs for modified GaN-based and AlGaInP-based micro-LEDs are illustrated in FIGS. 3A and 3B.

Referring to FIG. 18, the DEP forces are enhanced for all LEDs, and in particular, GaN-based blue and green LEDs do not display any DEP force drop at high frequencies above 100 kHz.

Therefore, a common assembly frequency for RGB LEDs can be optimized over a wide frequency range in accordance with the configuration and design of the assembly substrate.

The addition of a bottom metal layer also maximized the difference in conductivity between the top and bottom surfaces of a micro-LED, and this, in turn, improved the ratio of DEP force exertion on the bottom surface to that on the top surface by about 1.5 times.

Consequently, Micro LED structure with a lower metal layer enhanced the capability of MDSAT to select the correct LED surface for assembly.

Example 2

Three Factors that Influence the DEP Force: LED Chip Size, Electrode Gap, and Dielectric Layer on Assembly Electrodes According to Example 2, a study on how assembly substrate and LED chip size influence DEP force is conducted through COMSOL simulations. In particular, this Example 2 investigated the electrode gap (distance between two assembly electrodes) and the dielectric layer on the assembly electrodes, which are factors that typically affect electric field magnitude in assembly substrate, as well as LED chip size.

For COMSOL simulations, a square wave AC voltage was applied to the positive electrodes, and the corresponding electrodes were grounded on the assembly substrate as an input signal.

For the peak-to-peak amplitude and frequency of the input AC voltage, an optimal condition (12 $V_{pp}$ and 100 kHz) was prepared.

FIG. 19 depicts the 3D model used to calculate the DEP force.

FIG. 19 illustrates the three factors influencing the DPE force: the dielectric layer on the micro-LED chip, the electrode gap, and the assembly electrode.

As illustrated in FIG. 19(a), the LED chip according to the embodiment can include a GaN-based micro-LED with a circular cylindrical shape and a titanium layer on the bottom surface.

However, in the embodiments, gap ratio can be used instead of the electrode gap to investigate the independent influence of the two factors (electrode gap and LED chip size) on the DEP force, as depicted in FIG. 19(b),(c).

The gap ratio can be defined as the ratio of the distance between the two assembly electrodes to the micro-LED chip size. The electrode gap is distance between the two assembly electrodes.

FIG. 19(b) and FIG. 19(c) show the changes in the DEP force with respect to the LED size and gap ratio for the $SiO_2$ dielectric layer and the $Si_3N_4$ dielectric layer respectively.

FIG. 19(b) and FIG. 19(c) show that the DEP force increased with increases in the LED chip size and decreases in the gap ratio for both the $SiO_2$ and $Si_3N_4$ dielectric layers respectively.

Further, a comparison of FIG. 19(b) and FIG. 19(c) show indicates that the dielectric layer on the assembly substrate is an essential factor affecting the DEP force. Materials with high dielectric constants (e.g., the $Si_3N_4$ dielectric layer) increase the DEP force due to the Coulomb force, which enables the assembly of smaller LED chips.

According to the embodiments, the MDSAT method can exploit the additional technology (i.e., magnetic force) to effectively transport micro-LEDs, thus resulting in innovatively improved transfer yield, and the two forces (magnetic and DEP forces) can be controlled to compete during assembly.

Hence, the DEP force can be designed to be larger than the magnetic force when the assembly process occurs at the vicinity of the assembly holes.

Regarding the MDSAT method, the magnetic force acting on a micro-LED depends on the distance of the micro-LED from a magnet, and it ranges from $1 \times 10^{-8}$ [N] to $1.2 \times 10^{-7}$ [N], according to the results of COMSOL simulations.

Hence, to successfully assemble micro-LEDs, the DEP force can be greater than $1.2 \times 10^{-7}$ [N].

In terms of the LED chip size, which was studied from 10 μm to 50 μm as shown in FIG. 19(b), sub-20 μm sized LED chips could not be assembled for when the DEP force needs to be higher than $1.2 \times 10^{-7}$ [N], such as for the Sift dielectric layer.

However, a high dielectric constant material, such as the $Si_3N_4$ dielectric layer, makes it possible to assemble sub-20 μm sized LED chips, which is necessary for low-cost industrial applications.

Hence, the $Si_3N_4$ dielectric layer is chosen in this example. In terms of the electrode gap and LED chip size, 7.5 μm and 38 μm are respectively chosen with consideration of the process margin in assembly electrodes on the assembly substrate and the power line on top of the LED chip, respectively.

Manufacturing of the Assembly Device According to the Following Embodiment Will be Described.

First, an assembly substrate can be fabricated.

For example, a triple layer of Mo/Al/Mo (20/100/20 nm) was deposited through e-beam evaporation and patterned to define the assembly electrode area. For the patterning, a photoresist (DNR L-300, DONGJIN SEMICHEM) was spin coated at 2000 rpm for 40 sec, followed by soft-baking at 100° C. for 2 min, and patterning with 110 mJ/cm$^2$ UV light.

After the UV exposure, the substrate was baked at 110° C. for 2 min. The Mo/Al/Mo layer was then wet etched using an aluminum etchant for 10 min, after which the substrate was rinsed with DI water. Following this rinse, the $Si_3N_4$ dielectric layer on the assembly electrodes was deposited by plasma-enhanced chemical vapor deposition (PECVD). The $Si_3N_4$ dielectric layer prevents corrosion of the assembly electrodes; it also prevents electrochemical water splitting and short circuits caused by the bridge between the positive and common electrodes through the metal layers positioned on the bottom surface of the micro-LED.

Next, the assembly holes were fabricated. A photoresist (WPR-1052, JSR) was applied at 1500 rpm and soft-baked at 110° C. 2 min, followed by a 200 mJ/cm$^2$ UV exposure with a post exposure bake of 110° C. for 2 min. Finally, the substrate was developed using a developer (AZ-300MIF, MERCK) and baked for 1 hour at 200° C. in an oven.

Next, power lines can be fabricated.

For, example, after the assembly of micro-LEDs on assembly substrate, a photoresist (DPA-5000, DONGJIN SEMICHEM) layer was sprayed to fix the micro-LEDs, followed by soft baking at 100° C. for 2 min, UV exposure without a photomask, and baking for 15 min at 200° C. in an oven.

Afterwards, a photoresist (SU-8, MICROCHEM) layer was spin coated on the assembly substrate at 3000 rpm for 30 s for planarization. The SU-8 was then baked for 1 hour at 200° C. in the oven. To establish electrical connections between the micro-LEDs and power lines, a photoresist (GXR601, MERCK) was spun on the photoresist (SU-8, MICROCHEM) and patterned in a circular shape to define n-contact and p-contact on the micro-LEDs.

Afterwards, ashing process was performed using reactive ion etching (RIE), resulting in circular-shaped contact holes in the SU-8, after which a passivation layer of silicon dioxide formed on surface of the micro-LEDs was etched through the holes using RIE.

Afterwards, the photoresist (GXR601, MERCK) was stripped off; then circular-shaped contact holes in the SU-8 was formed on top of micro-LEDs for n-contact and p-contact. Next, a passivation layer ($SiO_2$) of the micro-LEDs was etched within the contact holes, where the purpose of the passivation layer is as noted in the fabrication of the GaN-based micro-LEDs in the Methods section.

Afterwards, transparent power lines made of indium tin oxide (ITO) were fabricated by a lift-off process, and these transparent power lines are shown in FIG. 15b. The ITO layer was deposited over the patterned photoresist (DNR L-300, DONGJIN SEMICHEM); then removal of the DNR L-300 using acetone lifts off the overlying ITO layers, resulting in transparent power lines.

Lastly, Ti/Al power lines were also fabricated by the lift-off process: the power lines were patterned by depositing the double layer of Ti/Al using e-beam over the patterned DNR L-300.

Next, GaN-based micro-LEDs can be fabricated.

For example, the GaN-based epitaxial layers on a sapphire wafer was prepared, and ITO was deposited on top. To define a mesa, a photoresist (GXR601, MERCK) was spun on the ITO at 2000 rpm for 30 sec, soft-baked for 2 min at 100° C., UV exposed, developed using the developer (AZ-300MIF, MERCK) for 70 sec, and lastly hard baked for 2 min at 110° C.

Then, an inductively-coupled plasma (ICP) etcher was used to etch the ITO/GaN-based epitaxial layers to form a mesa shape and the remaining photoresist was stripped off.

Afterwards, the outline of the micro-LED was defined and pixelated by applying and patterning of photoresist (DNR L-300, DONGJIN SEMICHEM) on the top, followed by ICP etching of the unmasked epitaxy area until the sapphire wafer was exposed.

Finally, n-contact metals (Cr/Ti/Ni/Ti, 20/20/100/70 nm) were fabricated on an n-region of the micro-LED through e-beam deposition and lift-off process.

A schematic view of the n-contact metals is provided in FIG. 3(a). The Ni layer embedded in the n-contact metals has a role in moving the micro-LED in response to the magnetic force. Afterward, a 500 nm-thick silicon dioxide (passivation layer) was deposited using PECVD on the sidewalls and top surface of each micro-LED, as shown in FIG. 3(a).

The passivation layer can reduce of leakage currents caused by dry etching damage. Also, the passivation layer can improve hydrophilization for free movement and preventing substrate adsorption (micro-LED sticking on the surface of the assembly substrate) as well as clumps (aggregation of the micro-LEDs). The passivation layer can have another merit in that the micro-LEDs that are not assembled in the assembly holes can be recycled as there is no substrate adsorption. Also, the passivation layer can spatially separate the Ni layer from the surface of the micro-LED, thus preventing the micro-LEDs from sticking together by magnetization after magnetic manipulation.

Next, fluidic dispersion process of GaN-based micro-LEDs can be processed.

The photoresist (GXR601, MERCK) was coated and patterned on top of the micro-LEDs and a pressure sensitive adhesive (PSA) film was then applied over it. Next, laser-lift-off (LLO) process was undertaken to detach the sapphire wafer and a 100 nm Ti layer was deposited on the exposed bottom surface of the micro-LEDs to improve DEP force response (see Example 1). Lastly, the micro-LEDs on the PSA film were dipped in acetone to dissolve the patterned photoresist on top, whereby the micro-LEDs were released from the PSA and dispersed into the acetone bath.

Next, AlGaInP-based micro-LEDs can be fabricated.

For example, an ITO layer was deposited on the AlGaInP-based epitaxial layers grown on a GaAs wafer.

The following process is involved in the making of the mesa and outline of the micro-LED. These processes are similar to those of the GaN-based micro-LEDs.

The same recipe was used for photolithography (spin coating, soft baking, UV exposure, development, and hard baking).

The same ICP etcher was used to etch the ITO/GaAs-based epitaxial layers to form a mesa shape, and the remaining photoresist was stripped off.

Afterwards, the outline of the micro-LED was defined and pixelated by applying and patterning the photoresist (DNR L-300, DONGJIN SEMICHEM) on the top, followed by ICP etching of the unmasked epitaxy area until the GaAs wafer was exposed.

Lastly, n-contact metals (AuGe/Au/Ti/Ni/Ti, 100/100/50/100/50 nm) were applied through e-beam deposition, followed by deposition of a 500 nm-thick layer of silicon dioxide on the sidewalls and top surface of the micro-LEDs.

Next, Fluidic dispersion process of AlGaInP-based micro-LEDs can be processed.

For example, the photoresist (GXR601, MERCK) was coated on top of the micro-LEDs; then, the side of the photoresist was attached over a glass wafer using a silicon adhesive.

Next, a chemical lift-off (CLO) process was performed to remove the GaAs wafer using a solution ($NH_4OH:H_2O_2:H_2O$), after which the passivation layer ($SiO_2$) formed between the micro-LEDs was removed by RIE.

Thereafter, a 100 nm Ti layer was deposited on the exposed bottom surfaces of the micro-LEDs to improve the DEP force responses (see Example 1).

Lastly, the micro-LEDs on the glass wafer were dipped in acetone to dissolve the patterned photoresist on the top, whereby the micro-LEDs were released from the glass wafer and dispersed in the acetone bath. A schematic view of the AlGaInP-based micro-LED is provided in Extended Data FIG. 1B.

Next, the MDSAT system according to the embodiment will be described.

The assembly can take place with the substrate facing down as well where the micro-LEDs placed on the bottom of the bath, beneath the substrate. In this case, a stronger magnetic force is required to overcome the gravitational force so that the micro-LEDs can be pulled up to the substrate. The main advantage of this scheme is that any unintended particles, that most likely will not possess magnetic properties, will be excluded from the assembly process because of their unresponsiveness to the magnetic field. On the other hand, the disadvantage is that bowing of the assembly substrate, which can have adverse effect on assembly uniformity and yield, is inevitable and hence it needs to be minimized.

Next, recycling of the micro-LED according to the embodiment will be described.

An array of magnet rod-included glass tubes, named to a magnetic tube, can be prepared to supply the micro-LEDs from the bath chamber above. Inside the magnetic tube, the magnet rod can move vertically inward and toward to end of the glass tube. Consequently, the micro-LEDs can adhere to the end surface of the glass tube or fall off through the vertical movement of the magnet inside the glass tube. The amount supplied by each magnetic tube can be 2-3 mg in weight. According to embodiments, when the number of LEDs is 2-3 mg, the assembly yield is not affected. The array of magnetic tube drops the LEDs right above the assembly substrate in the bath chamber. The array of magnetic tubes is used again after the self-assembly process to collect the LEDs for recycling and prepare for the next run.

On the other hand, the micro-LEDs do not adhere to the surface of the assembly substrate, so clumps (micro-LED aggregates) caused by magnetization cannot formed in the MDSAT method. Thus, the MDSAT method according to embodiment can have the advantage of the ability to recycle the micro-LEDs.

The embodiment may be adopted in the display field for displaying images or information.

The embodiment may be adopted in the display field for displaying images or information using a semiconductor light emitting device.

The embodiment may be adopted in the display field for displaying images or information using micro-level or nano-level semiconductor light emitting devices.

What is claimed is:

1. A semiconductor light emitting device for display pixels, comprising:
a light emitting structure including a first conductivity type semiconductor layer, an active layer, and a second conductivity type semiconductor layer;
a first contact electrode electrically connected to the first conductivity type semiconductor layer;
a metal layer disposed under the first conductivity-type semiconductor layer;
a second contact electrode disposed on the second conductivity type semiconductor layer; and
a passivation layer disposed on the light emitting structure,
wherein the metal layer includes a magnetic material, and
wherein a weight ratio of the magnetic material to the weight of the semiconductor light emitting device is 0.25% to 36.75%.

2. The semiconductor light emitting device according to claim 1, wherein the magnetic material comprises Ni.

3. A display device, comprising:
a first assembly electrode and a second assembly electrode spaced apart from each other;
a dielectric layer disposed on the first and second assembly electrodes;
an insulating layer having an assembly hole and disposed on the dielectric layer; and
a semiconductor light emitting device disposed on the assembly hole;
wherein the semiconductor light emitting device is the semiconductor light emitting device according to claim 2.

4. The semiconductor light emitting device according to claim 1, wherein a thickness of the magnetic material is 10 nm to 2300 nm.

5. A display device, comprising:
a first assembly electrode and a second assembly electrode spaced apart from each other;
a dielectric layer disposed on the first and second assembly electrodes;
an insulating layer having an assembly hole and disposed on the dielectric layer; and
a semiconductor light emitting device disposed on the assembly hole;
wherein the semiconductor light emitting device is the semiconductor light emitting device according to claim 3.

6. The semiconductor light emitting device according to claim 1, wherein the first contact electrode is disposed while surrounding a circumference of the second contact electrode, and
wherein an upper side of the light emitting structure is electrically connected to the first conductivity type semiconductor layer partially removed thereof.

7. A display device, comprising:
a first assembly electrode and a second assembly electrode spaced apart from each other;
a dielectric layer disposed on the first and second assembly electrodes;
an insulating layer having an assembly hole and disposed on the dielectric layer; and a semiconductor light emitting device disposed on the assembly hole;

wherein the semiconductor light emitting device is the semiconductor light emitting device according to claim 4.

8. A display device, comprising:
a first assembly electrode and a second assembly electrode spaced apart from each other;
a dielectric layer disposed on the first and second assembly electrodes;
an insulating layer having an assembly hole and disposed on the dielectric layer; and
a semiconductor light emitting device disposed on the assembly hole;
wherein the semiconductor light emitting device is the semiconductor light emitting device according to claim 1.

9. The display device according to claim 8, wherein a height of the assembly hole is 4.0 μm or more.

10. The display device according to claim 9, wherein the height of the assembly hole is 4.5 μm to 5.0 μm.

11. The display device according to claim 8, wherein the dielectric layer comprises a nitride.

12. The display device according to claim 11, wherein the dielectric layer comprises $Si_3N_4$.

13. The display device according to claim 8, wherein a gap ratio, which is a ratio of a distance ratio between the spaced first and second assembly electrodes to a size of the semiconductor light emitting element, is 0.4 to 0.8.

* * * * *